(12) United States Patent
Hagishima et al.

(10) Patent No.: US 8,120,090 B2
(45) Date of Patent: Feb. 21, 2012

(54) AGING DEVICE

(75) Inventors: Daisuke Hagishima, Tokyo (JP);
Hiroshi Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 924 days.

(21) Appl. No.: 11/856,256

(22) Filed: Sep. 17, 2007

(65) Prior Publication Data
US 2008/0079057 A1 Apr. 3, 2008

(30) Foreign Application Priority Data
Sep. 28, 2006 (JP) .................................. 2006-265985

(51) Int. Cl.
*H01L 29/788* (2006.01)
(52) U.S. Cl. ......... 257/315; 257/316; 257/317; 257/320
(58) Field of Classification Search .................. None
See application file for complete search history.

(56) References Cited

U.S. PATENT DOCUMENTS

| | | | | |
|---|---|---|---|---|
| 5,656,838 | A * | 8/1997 | Shinmori | 257/315 |
| 5,675,176 | A * | 10/1997 | Ushiku et al. | 257/617 |
| 5,801,414 | A * | 9/1998 | Shinmori | 257/315 |
| 6,077,748 | A * | 6/2000 | Gardner et al. | 438/296 |
| 6,114,767 | A * | 9/2000 | Nagai et al. | 257/758 |
| 7,075,284 | B2 | 7/2006 | Watanabe et al. | |
| 7,208,933 | B2 | 4/2007 | Watanabe et al. | |
| 7,224,157 | B2 | 5/2007 | Watanabe et al. | |
| 7,248,034 | B2 | 7/2007 | Watanabe et al. | |
| 2004/0201052 | A1* | 10/2004 | Nakashiba | 257/296 |
| 2005/0199936 | A1* | 9/2005 | Wang et al. | 257/314 |
| 2006/0011971 | A1* | 1/2006 | Hara | 257/316 |
| 2007/0158699 | A1* | 7/2007 | Watanabe et al. | 257/264 |
| 2007/0215934 | A1* | 9/2007 | Tagaki | 257/315 |

FOREIGN PATENT DOCUMENTS

| | | | |
|---|---|---|---|
| JP | 59-181062 | | 10/1984 |
| JP | 6-21208 | | 1/1994 |
| JP | 06021208 A | * | 1/1994 |
| JP | 8-139177 | | 5/1996 |
| JP | 2004-94922 | | 3/2004 |
| JP | 2005-310824 | | 11/2005 |
| JP | 2006-13334 | | 1/2006 |

OTHER PUBLICATIONS

U.S. Appl. No. 12/049,715, filed Mar. 17, 2008, Watanabe, et al.
U.S. Appl. No. 12/173,535, filed Jul. 15, 2008, Watanabe, et al.

* cited by examiner

*Primary Examiner* — Ha Tran T Nguyen
*Assistant Examiner* — Shantanu C Pathak
(74) *Attorney, Agent, or Firm* — Oblon, Spivak, McClelland, Maier & Neustadt, L.L.P.

(57) ABSTRACT

An aging device includes a semiconductor substrate, an element isolation insulating layer which is formed in a recessed portion of the semiconductor substrate and which has an upper surface higher than an upper surface of the semiconductor substrate, first and second element regions isolated by the element isolation insulating layer, first and second diffusion layers formed in the semiconductor substrate in the first element region, a first gate insulating film formed on the semiconductor substrate between the first and second diffusion layers, a second gate insulating film formed on the semiconductor substrate in the second element region, and a floating gate electrode formed on the first and second gate insulating films and formed to extend from the first element region to the second element region. The deepest portions of the first and second diffusion layers are isolated from the element isolation insulating layer.

13 Claims, 24 Drawing Sheets

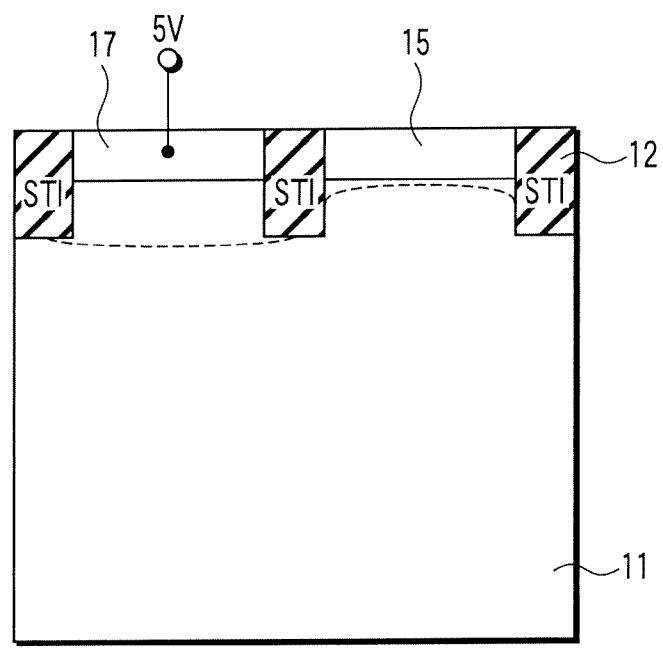
F I G. 7
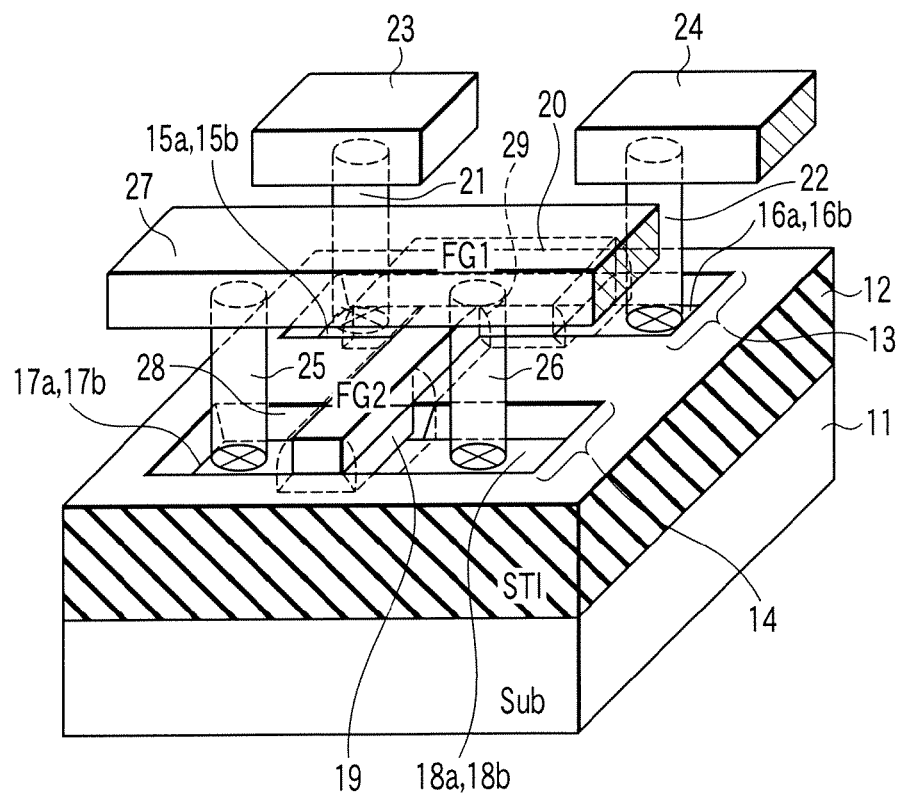
F I G. 8

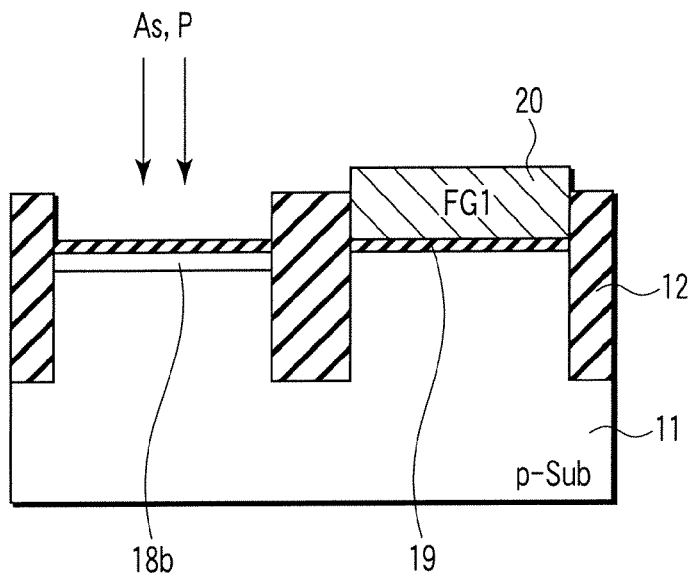
F I G. 36
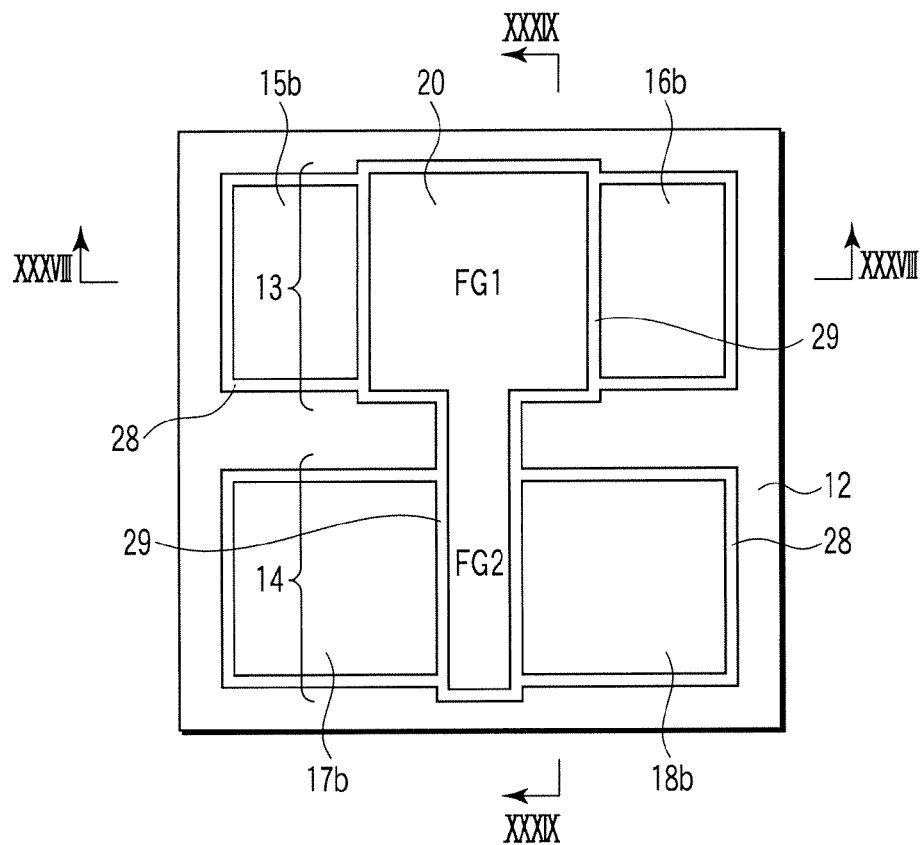
F I G. 37

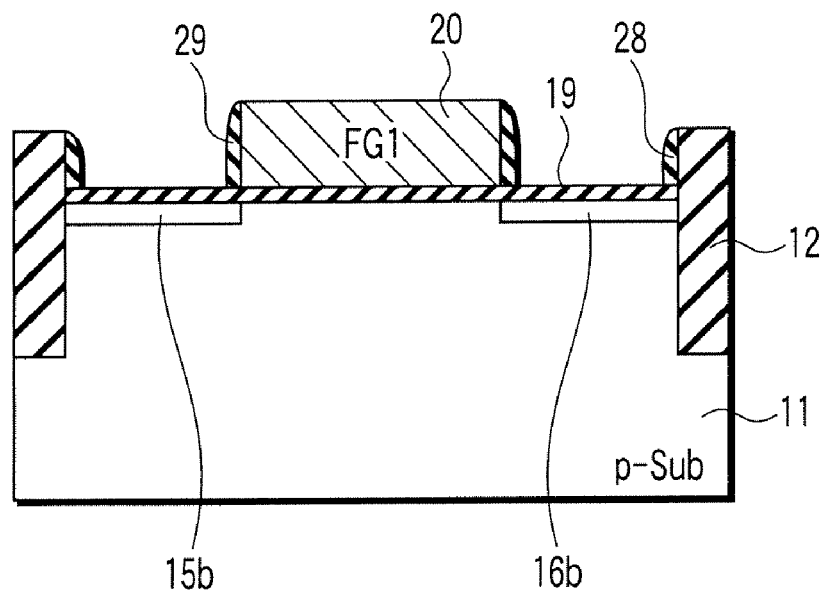
F I G. 38
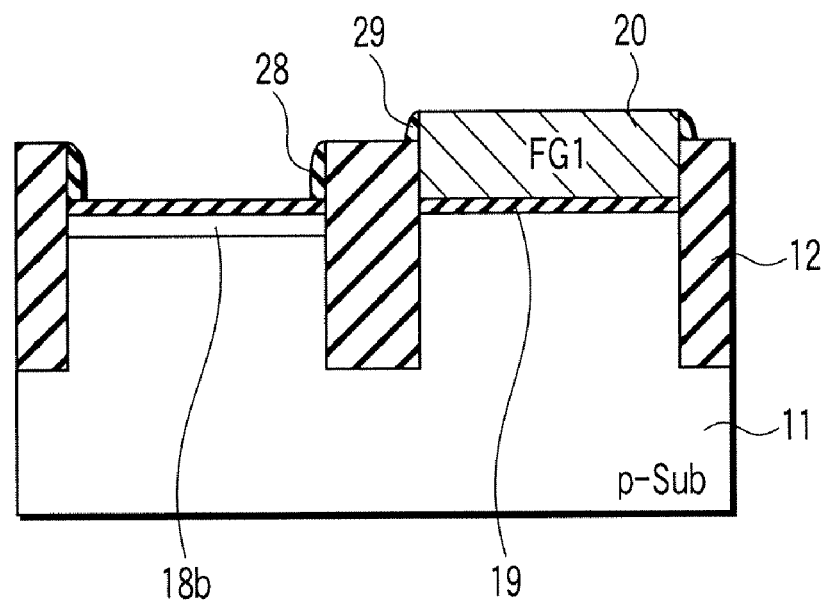
F I G. 39

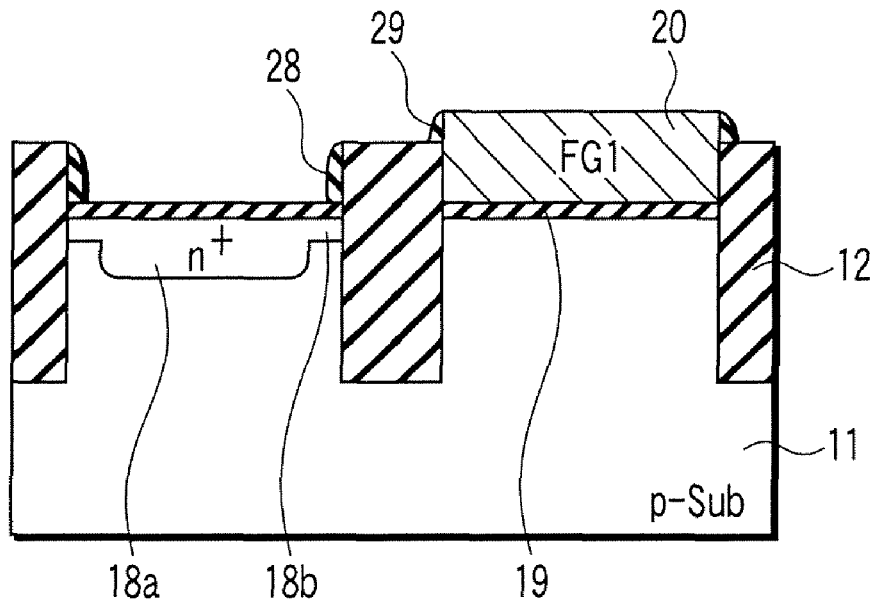
F I G. 42
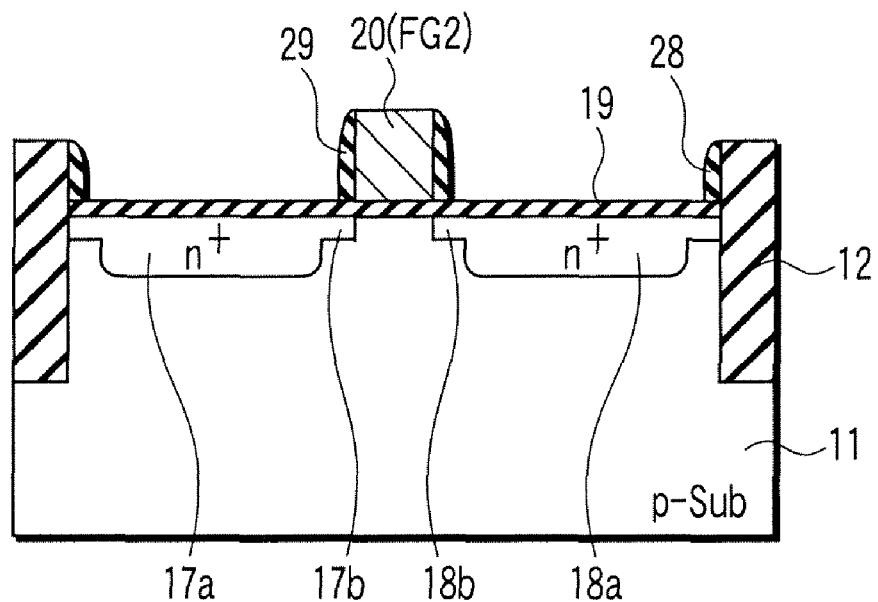
F I G. 43

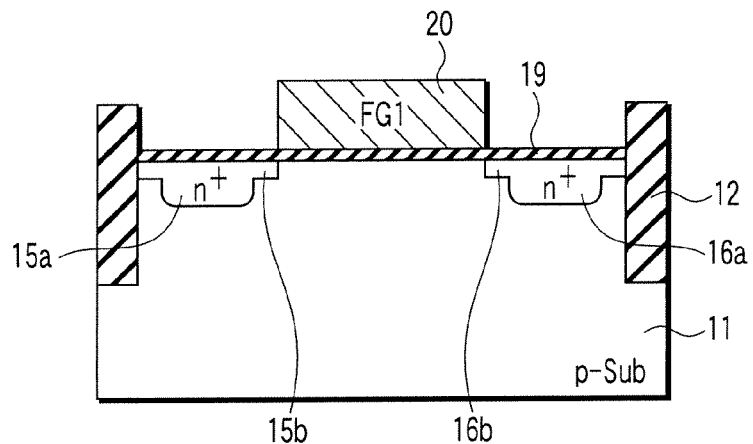
F I G. 48
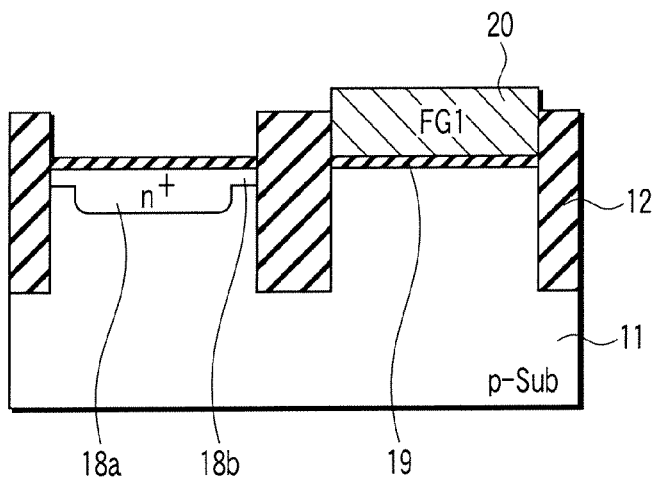
F I G. 49
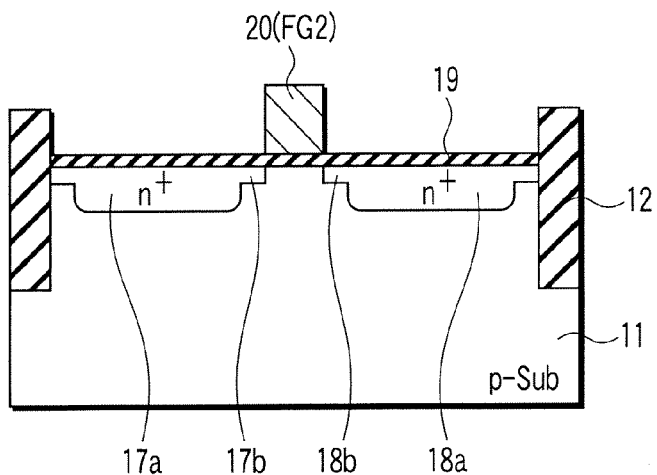
F I G. 50

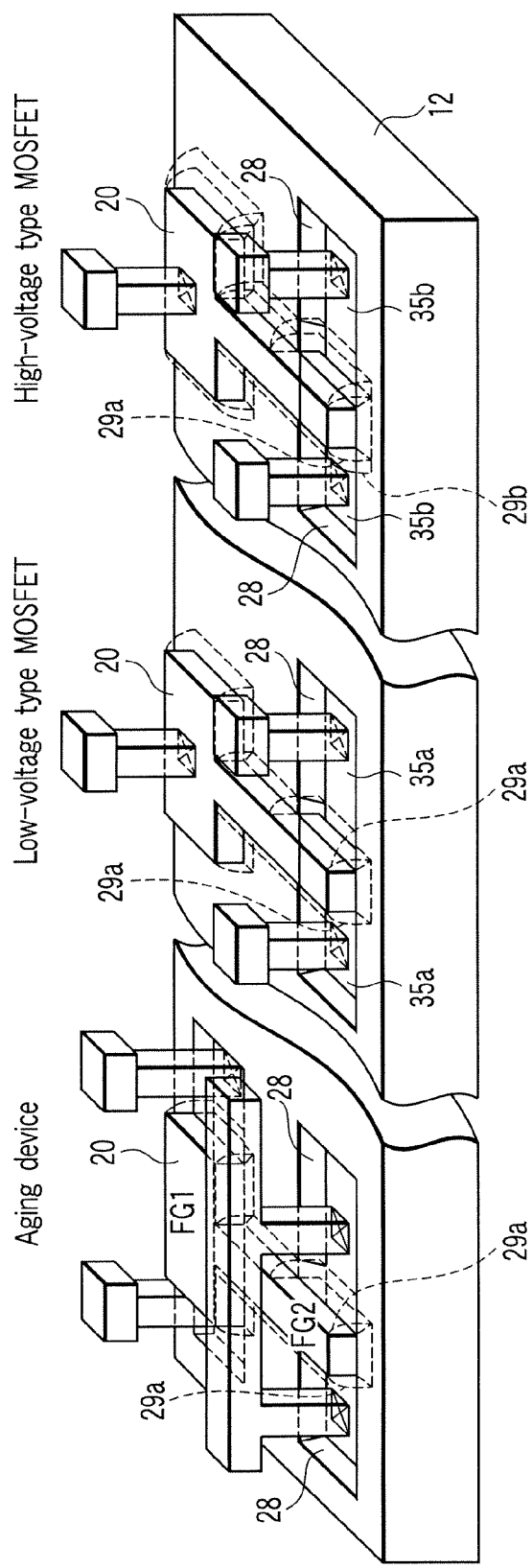
F I G. 51

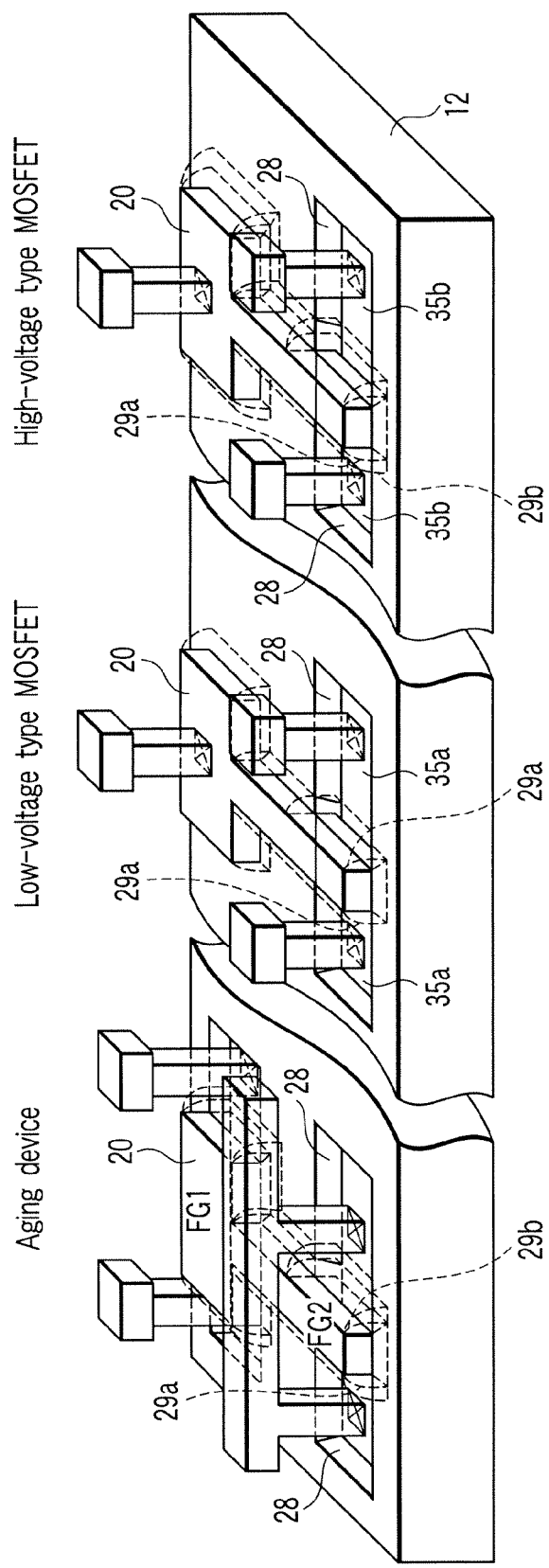
F I G. 52

AGING DEVICE

CROSS-REFERENCE TO RELATED APPLICATIONS

This application is based upon and claims the benefit of priority from prior Japanese Patent Application No. 2006-265985, filed Sep. 28, 2006, the entire contents of which are incorporated herein by reference.

BACKGROUND OF THE INVENTION

1. Field of the Invention

The present invention relates to an aging device serving as an electronic timer being free from a battery.

2. Description of the Related Art

In recent years, an electronic timer being free from a battery, i.e., a change-over-time device (to be referred to as an aging device) the output of which changes with an elapse of time is beginning to be used in fields of contents distribution, credit cards, rental digital products, rental digital software, and the like.

The aging device has a stack gate structure constituted by a floating gate electrode and a control gate electrode and functions as an electronic timer which measures a predetermined period by a retention characteristic (aging) of electric charges in the floating gate electrode (for example, see JP-A 2004-94922 (KOKAI), JP-A 2004-172404 (KOKAI), and JP-A 2005-310824).

According to the aging device, for example, a tunnel insulating film is changed in thickness to make it possible to change the aging.

However, electric charge leakage from the floating gate electrode changes depending on a manufacturing fluctuation. For this reason, in order to cause the aging device to function as an accurate electronic timer, a complex circuit to eliminate an error generated by the manufacturing fluctuation is required.

As fields in which the aging devices are used spread, the agings of the aging devices must be set to cope with business models, respectively. Since this means that a plurality of production lines of aging devices must be installed in correspondence with the agings, the production cost increases.

BRIEF SUMMARY OF THE INVENTION

An aging device according to an aspect of the present invention comprises a semiconductor substrate, an element isolation insulating layer which is formed in a recessed portion of the semiconductor substrate and which has an upper surface higher than an upper surface of the semiconductor substrate, first and second element regions isolated by the element isolation insulating layer, first and second diffusion layers formed in the semiconductor substrate in the first element region, a first gate insulating film formed on the semiconductor substrate between the first and second diffusion layers, a second gate insulating film formed on the semiconductor substrate in the second element region, and a floating gate electrode formed on the first and second gate insulating films and formed to extend from the first element region to the second element region, wherein the deepest portions of the first and second diffusion layers are isolated from the element isolation insulating layer.

BRIEF DESCRIPTION OF THE SEVERAL VIEWS OF THE DRAWING

FIG. 7 is a diagram showing a simulation result of spreading of the depletion layer;

FIG. 8 is a perspective view showing an aging device according to an embodiment;

FIG. 36 is a sectional view along the XXXVI-XXXVI line in FIG. 34;

FIG. 37 is a plan view showing one step of the method of manufacturing an aging device;

FIG. 38 is a sectional view along the XXXVIII-XXXVIII line in FIG. 37;

FIG. 39 is a sectional view along the XXXIX-XXXIX line in FIG. 37;

FIG. 42 is a sectional view along the XLII-XLII in FIG. 40;

FIG. 43 is a sectional view along the XLIII-XLIII line in FIG. 40;

FIG. 48 is a sectional view along the XLVIII-XLVIII line in FIG. 47;

FIG. 49 is a sectional view along the XLIX-XLIX line in FIG. 47;

FIG. 50 is a sectional view along the L-L line in FIG. 47;

FIG. 51 is a diagram showing a relationship between an aging device and a peripheral circuit; and FIG. 52 is a diagram showing a relationship between an aging device and a peripheral circuit.

DETAILED DESCRIPTION OF THE INVENTION

An aging device of an aspect of the present invention will be described below in detail with reference to the accompanying drawings.

1. Outline

In an example of the present invention, a single-polysilicon type aging device in which a floating gate electrode of a MIS type device serving as an operation element in a first element region and a floating gate electrode of a MIS type device serving as a control element in a second element region are coupled to each other, there are proposed a structure in which a deepest portion of a diffusion layer of the operation element is isolated from an element isolation insulating layer, a structure in which a deepest portion of a diffusion layer of the control element is isolated from an element isolation insulating layer, and manufacturing methods to obtain these structures.

According to the structures and the manufacturing method, a design margin is increased without increasing a manufacturing cost to make it possible to control an aging of an aging device at high accuracy.

Distances between the deepest portions of the diffusion layers of the operation element and the control element and the element isolation insulating layer are changed to make it possible to control a position of a distal end of a depletion layer extending from interfaces between a semiconductor substrate and the diffusion layers to the inside of the semiconductor substrate. For this reason, the present invention can cope with various specifications of aging devices without changing a width (production line) of the element isolation insulating layer.

2. Embodiment (1) Single-Polysilicon Type Aging Device

A memory cell of a flash memory is diverted to one of aging devices. However, in this case, the aging device has a stack gate structure. For this reason, for example, in consideration of mixed mounting of the aging device and a CMOS circuit, matching between processes of the aging device and processes of the CMOS circuit is posed as a problem.

Therefore, a single-polysilicon type aging device has been attracting attention.

Figure 1:
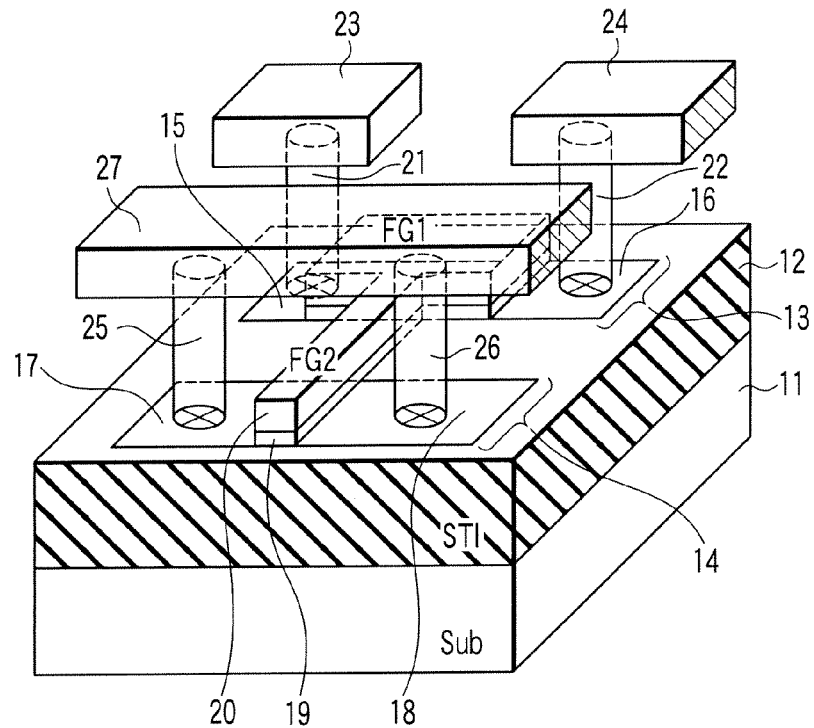
FIG. 1 is a perspective view showing an aging device serving as a comparative example.

FIG. 1 shows a single-polysilicon type aging device.

The single-polysilicon type aging device is constituted by an operation element and a control element. The operation element and the control element are constituted by MIS type devices, for example, MIS type field effect transistors, respectively.

An element isolation insulating film 12 having an STI (Shallow Trench Isolation) structure is formed in a recessed portion of a semiconductor substrate 11. Element regions 13 and 14 are isolated by the element isolation insulating layer 12. An operation element is formed in the element region 13, and a control element is formed in the element region 14.

The operation element (MIS type field effect transistor) is constituted by diffusion layers 15 and 16 formed in the semiconductor substrate 11 in the element region 13, a gate insulating film 19 formed on the semiconductor substrate (channel region) 11 between the diffusion layers 15 and 16, and a floating gate electrode 20 on the gate insulating film 19.

The control element (MIS type field effect transistor) is constituted by diffusion layers 17 and 18 formed in the semiconductor substrate 11 in the element region 14, the gate insulating film 19 formed on the semiconductor substrate (channel region) 11 between the diffusion layers 17 and 18, and the floating gate electrode 20 on the gate insulating film 19.

The floating gate electrode 20 is formed to extend from the element region 13 to the element region 14. An area of the floating gate electrode 20 facing the semiconductor substrate 11 in the element region 13 is larger than an area of the floating gate electrode 20 facing the semiconductor substrate 11 in the element region 14.

For example, as in this example, it is assumed that a channel width of the MIS type field effect transistor serving as the operation element is equal to a channel width of the MIS type field effect transistor serving as the control element. In this case, a channel length of the MIS type field effect transistor serving as the operation element is laid out to be larger than a channel length of the MIS type field effect transistor serving as the control element.

In this case, a planar shape of the floating gate electrode 20 is a T shape (when viewed from above the semiconductor substrate 11).

The floating gate electrode 20 can be constituted by a conductive polysilicon layer, a metal layer, a silicide layer, or a lamination layer thereof. When the floating gate electrode 20 contains conductive polysilicon, the conductive polysilicon contains an n-type impurity or a p-type impurity.

The diffusion layer 15 of the operation element is connected to a conductive layer (electrode) 23 through a contact plug 21. The diffusion layer 16 of the operation element is connected to a conductive layer (electrode) 24 through a contact plug 22.

The diffusion layers 17 and 18 of the control element are connected to a conductive layer (electrode) 27 through contact plugs 25 and 26, respectively.

In the single-polysilicon type aging device having the above structure, when the semiconductor substrate 11 is of an n-type and the diffusion layers 15, 16, 17, and 18 are of p-types, the operation element and the control element are p-channel MIS type field effect transistors. When the semiconductor substrate 11 is of a p-type, and the diffusion layers

15, 16, 17, and 18 are of n-types, the operation element and the control element are n-channel MIS type field effect transistors.

Functions of the single-polysilicon type aging device serving as a timer will be described below.

When the operation element and the control element are n-channel MIS type field effect transistors, the operation element and the control element function as follows.

When a positive potential is applied to the conductive layer 27, electrons in the floating gate electrode (FG2) 20 are discharged to the semiconductor substrate 11 in the n-channel MIS type field effect transistor serving as the control element. For this reason, the floating gate electrode 20 has a positive potential.

As a result, thereafter, even if the positive potential applied to the conductive layer 27 is canceled, the floating gate electrode (FG2) 20 maintains the positive potential. Therefore, the n-channel MIS type field effect transistor serving as the operation element is turned on.

However, the floating gate electrode 20 has a structure which can easily leak a current. For this reason, after the positive potential applied to the conductive layer 27 is canceled, electrons are gradually implanted into the floating gate electrode 20.

Therefore, after a predetermined period of time, the potential of the floating gate electrode 20 is lower than a threshold voltage of the n-channel MIS type field effect transistor serving as the operation element. For this reason, the operation element is turned off.

In the single-polysilicon type aging device, in an initial state, the operation element is turned on and, after a predetermined period of time, the operation element is turned off. For this reason, the single-polysilicon type aging device is called a so-called normally-off type aging device.

In this manner, the MIS type field effect transistor serving as the operation element realizes a function of a timer by using a phenomenon in which the MIS type field effect transistor is changed from an on state to an off state by a leakage current. The initial state of the aging device is controlled by a control element to make it possible to accurately control the aging of the aging device.

By the way, in the single-polysilicon type aging device, since the initial state is set by the control element, an area of the floating gate electrode 20 facing the semiconductor substrate 11 in the element region 13 is made larger than an area of the floating gate electrode 20 facing the semiconductor substrate 11 in the element region 14.

At this time, a capacitance between the semiconductor substrate 11 and the floating gate electrode (FG2) 20 on the control element side is larger than a capacitance between the semiconductor substrate 11 and the floating gate electrode (FG1) 20 on the operation element side. For this reason, when a potential is applied to the conductive layer 27, an amount of potential drop in the gate insulating film 19 on the control element side is larger than in the gate insulating film 19 on the operation element side.

Therefore, in the control element, implantation/discharging of electric charges in/from the floating gate electrode 20 can be efficiently performed.

Figure 2:
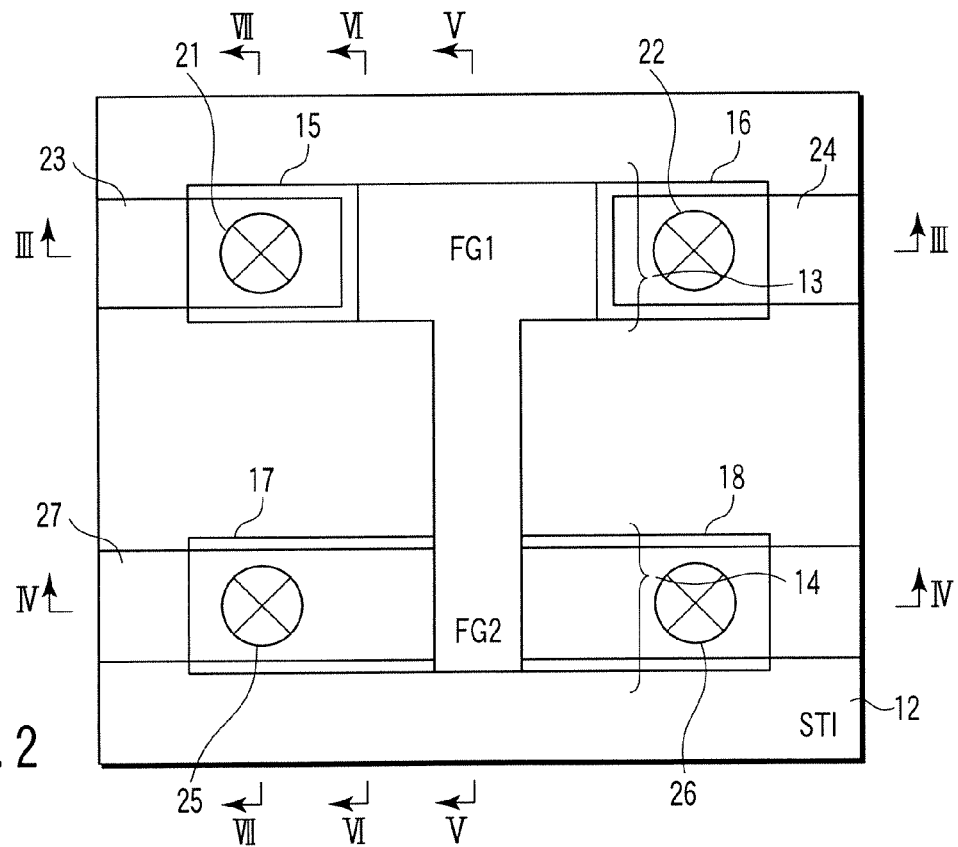
FIG. 2 is a plan view of the aging device in FIG. 1.
Figure 3:
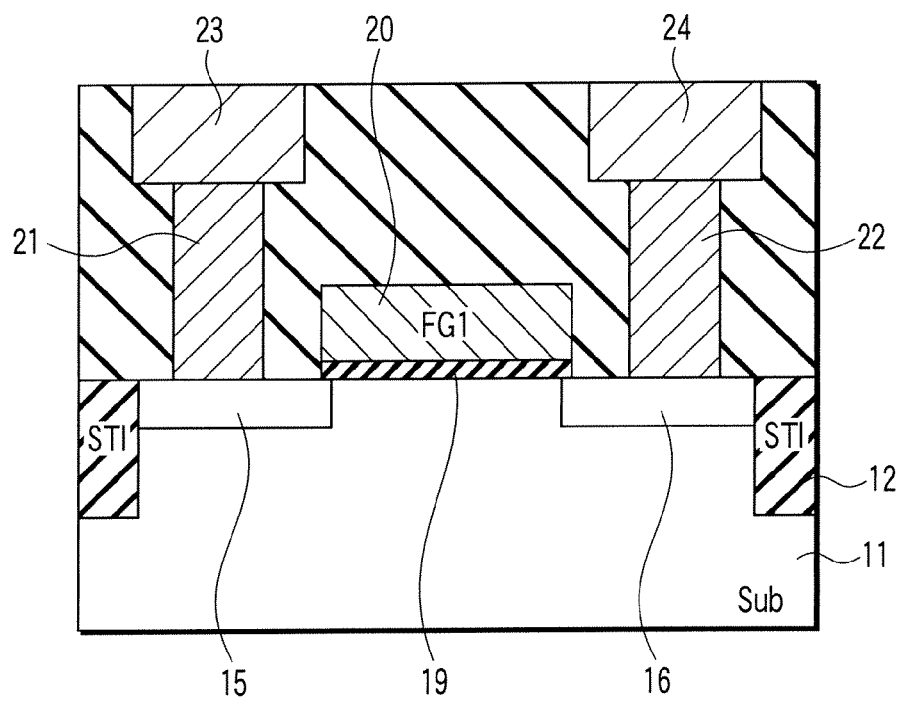
FIG. 3 is a sectional view along the III-III line in FIG. 2.

FIG. 2 is an upper view of the aging device in FIG. 1. FIG. 3 is a sectional view along the III-III line in FIG. 2, FIG. 4 is a sectional view along the IV-IV line in FIG. 2, and FIG. 5 is a sectional view along the V-V line in FIG. 2.

The operation element, as shown in FIG. 3, is constituted by a MIS type device. This MIS type device is different from a normal MIS type field effect transistor in that the floating gate electrode 20 is electrically in a floating state.

Figure 4:
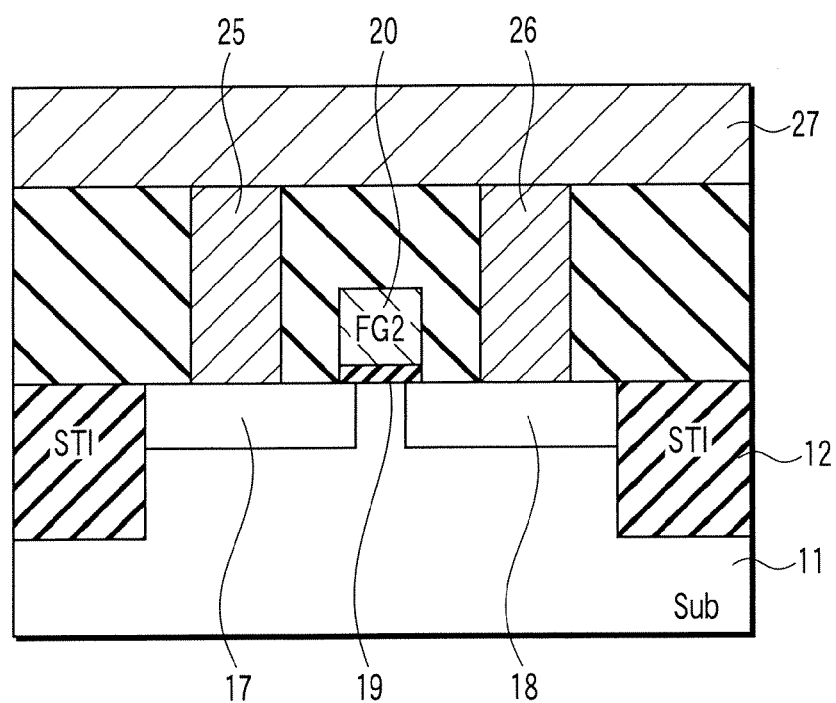
FIG. 4 is a sectional view along the IV-IV line in FIG. 2.
Figure 5:
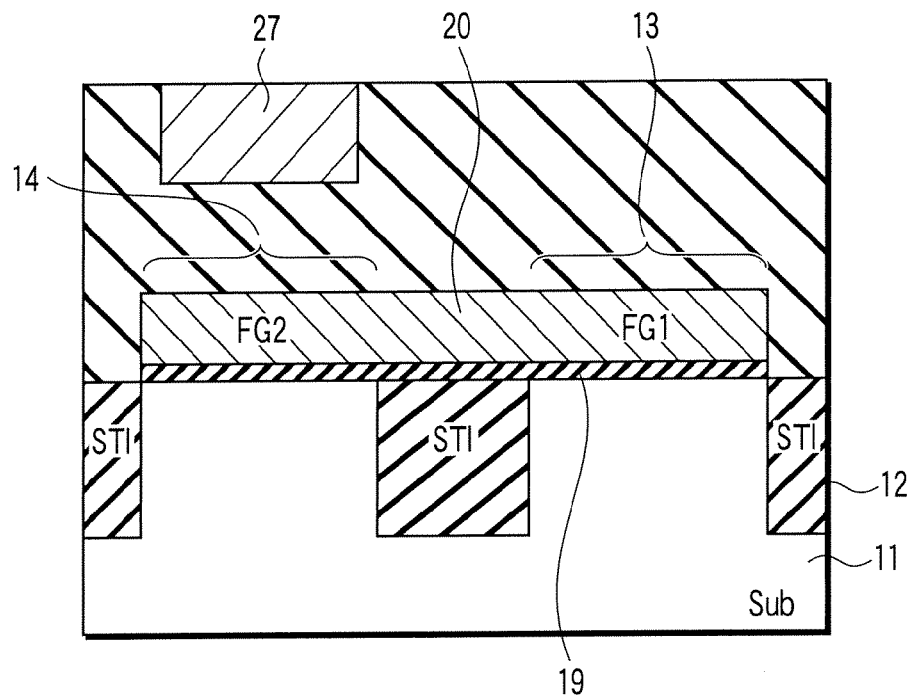
FIG. 5 is a sectional view along the V-V line in FIG. 2.

The control element, as shown in FIG. 4, is also constituted by a MIS type device. This MIS type device is different from a normal MIS type field effect transistor in that the floating gate electrode 20 is electrically in a floating state and the diffusion layers 17 and 18 serving as source/drain are short-circuited by the conductive layer (electrode) 27.

In this case, the initial state is set in such a manner that, as described above, a positive potential is applied to the conductive layer 27 and the control element discharges electrons in the floating gate electrode 20 into the semiconductor substrate (channel region) 11. At this time, the floating gate electrode 20 has a positive potential by capacitive coupling to the channel region.

When the floating gate electrode 20 has the positive potential, pn junction surfaces between the diffusion layers 15, 16, 17, and 18 of the MIS type devices serving as the control element and the operation element and the semiconductor substrate 11 and a depletion layer generated thereby extend.

The depletion layer falls within the element region when the potential (positive potential) of the floating gate electrode 20 is low. However, when the potential becomes high, the depletion layer extends to a portion immediately below the element isolation insulating layer 12.

In the worst case, the depletion layer extending from the control element side is brought into contact with the depletion layer extending from the operation element side to generate a leakage current (punch through phenomenon) between the control element and the operation element.

Such a phenomenon is not preferable to accurately design an aging of the single-polysilicon type aging device because the phenomenon prevents an accurate number of electric charges from being implanted in the floating gate electrode 20. The leakage current disadvantageously causes an increase in power consumption.

Figure 6:
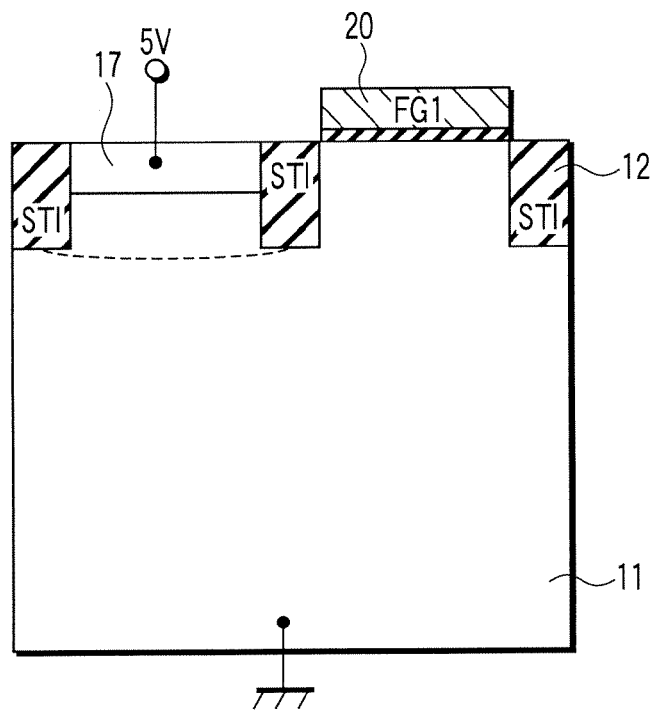
FIG. 6 is a diagram showing a simulation result of spreading of a depletion layer.

FIGS. 6 and 7 show simulation of spreading of a depletion layer in an initial setting (write) state.

A target is an aging device having the structure shown in FIGS. 1 to 5. Therefore, FIG. 6 corresponds to a section along the VI-VI line in FIG. 2, and FIG. 7 corresponds to a section along the VII-VII line in FIG. 2.

The semiconductor substrate 11 was of a p-type and had an impurity concentration of $5 \times 10^{17}$ cm$^{-3}$, the diffusion layers 15, 16, 17, and 18 were of n-types and had impurity concentrations of $1 \times 10^{20}$ cm$^{-3}$, and the potentials of the diffusion layers 17 and 18 were set at 5V, so that simulation was performed.

As a result, the depletion layers generated in the control element and the operation element extended to a portion immediately below the element isolation insulating layer (STI) 12.

Since the above numerical values are general conditions to execute writing in an aging device, a technique which prevents the depletion layers from spreading to the portion immediately below the element isolation insulating layer 12 under the above conditions is required.

As techniques which suppress spreading of a depletion layer, the following three techniques are known.

Countermeasure 1: highly concentrating of substrate, formation of Halo

Since spreading of the depletion layer depends on an impurity concentration, spreading of the depletion layer can be suppressed by highly concentrating the semiconductor substrate. The Halo is a highly-concentrated region partially formed in the semiconductor substrate to obtain the same effect as that of the highly concentrating of the substrate.

However, the countermeasures increase a channel resistance of a field effect transistor and decrease a drive current.

Countermeasure 2: Ion Implantation of Impurity

In ion implantation of an impurity, an impurity is ion-implanted in a portion immediately below an element isolation insulating layer and a portion nearby to form a highly concentrated region. The ion implantation effectively suppresses depletion at a portion immediately below the element isolation insulating layer and a portion nearby without increasing a channel resistance of the field effect transistor.

However, in order to perform ion implantation, a mask must be formed by a PEP (photo engraving process) to cause an increase in manufacturing cost.

Countermeasure 3: Optimization of width of element isolation insulating layer

When the width of the element isolation insulating layer (for example, STI) is increased, a distance between the control element and the operation element increases. For this reason, the depletion layers generated in both the elements do not easily come in contact with each other.

However, in this case, the width of the element isolation insulating layer must be changed depending on operation conditions of the aging device. In CMOS circuits (LSI) to which the aging device is applied, the widths of element isolation insulating layers are determined depending on generations. For this reason, when an element isolation insulating layer is to be changed in width, CMOS processes must be changed. In this case, the manufacturing cost considerably increases.

As described above, all the techniques have problems inherent therein, and are not suitable for application to an aging device. In particular, the problem of manufacturing cost is crucial to a single-polysilicon type aging device which emphasizes a low price.

3. Embodiment (1) Structure of Aging Device

FIG. 8 shows a single-polysilicon type aging device.

As characteristic features of the aging device, an upper surface of the element isolation insulating layer 12 having an STI structure is above the level of an upper surface of the semiconductor substrate 11, and a side wall insulating film 28 is formed on a side wall of the element isolation insulating layer 12.

Deep and concentrated diffusion layers 15a, 16a, 17a, and 18a functioning as sources/drains are not formed in the element regions 13 and 14 immediately below the side wall insulating film 28. The diffusion layers 15a, 16a, 17a, and 18a are formed in the element regions 13 and 14 except for a region immediately below the side wall insulating film 28.

A side wall insulating film 29 is also formed on a side wall of the floating gate electrode (FG1 and FG2) 20. In the element regions 13 and 14 immediately below the side wall insulating films 28 and 29, diffusion layers 15b, 16b, 17b, and 18b which function as sources/drains and which are shallower and thinner than the diffusion layers 15a, 16a, 17a, and 18a are formed.

The diffusion layers 15b, 16b, 17b, and 18b in the element regions 13 and 14 immediately below the side wall insulating film 29 are called extension regions or LDD (light doped drain) regions of a MIS type field effect transistor.

According to this structure, the deepest portions of the diffusion layers 15a, 15b, 16a, and 16b of the operation element, i.e., bottom surfaces of the diffusion layers 15a and 16a serving as sources/drains are isolated from the element isolation insulating layer 12.

The deepest portions of the diffusion layers 17a, 17b, 18a, and 18b of the control element, i.e., bottom surfaces of the diffusion layers 17a and 18a serving as sources/drains are isolated from the element isolation insulating layer 12.

In this manner, the following problem can be solved. That is, in an initial setting (writing), pn-junctions between the semiconductor substrate 11 and the diffusion layers 15a and 16a, a depletion layer generated nearby, pn-junctions between the semiconductor substrate 11 and the diffusion layers 17a and 18a and a depletion layer generated nearby are extended to a portion immediately below the element isolation insulating layer 12 and coupled to each other.

The effect is realized in such a manner that one of the deepest portions of the diffusion layers 15a and 16a of the operation element and the deepest portions of the diffusion layers 17a and 18a of the control element is isolated from the element isolation insulating layer 12.

The embodiment proposes the structure in which the bottom surfaces of the diffusion layers 15a, 16a, 17a, and 18a are isolated from the element isolation insulating layer 12 by using the side wall insulating film 28. However, the side wall insulating film 28 is not always necessary.

As will be described below, when a mask process is used, it is possible to realize a structure in which the bottom surfaces of the diffusion layers 15a, 16a, 17a, and 18a are isolated from the element isolation insulating layer 12 without using the side wall insulating film 28.

However, in consideration of flexibility that can cope with a change in specification of an aging device without increasing manufacturing cost, use of the side wall insulating film 28 is more practical than the use of the mask process.

The diffusion layers 15b, 16b, 17b, and 18b serving as extension regions or LDD regions of the MIS type field effect transistor are not essential. In absence of the diffusion layers 15b, 16b, 17b, and 18b, the MIS type field effect transistor can function as an aging device.

Furthermore, the MIS type device serving as the operation element must be a field effect transistor. However, the MIS type device serving as the control element is not necessarily a field effect transistor because it suffices that electric charges are discharged/implanted for the floating gate electrode 20 in the initial setting.

Figure 9:
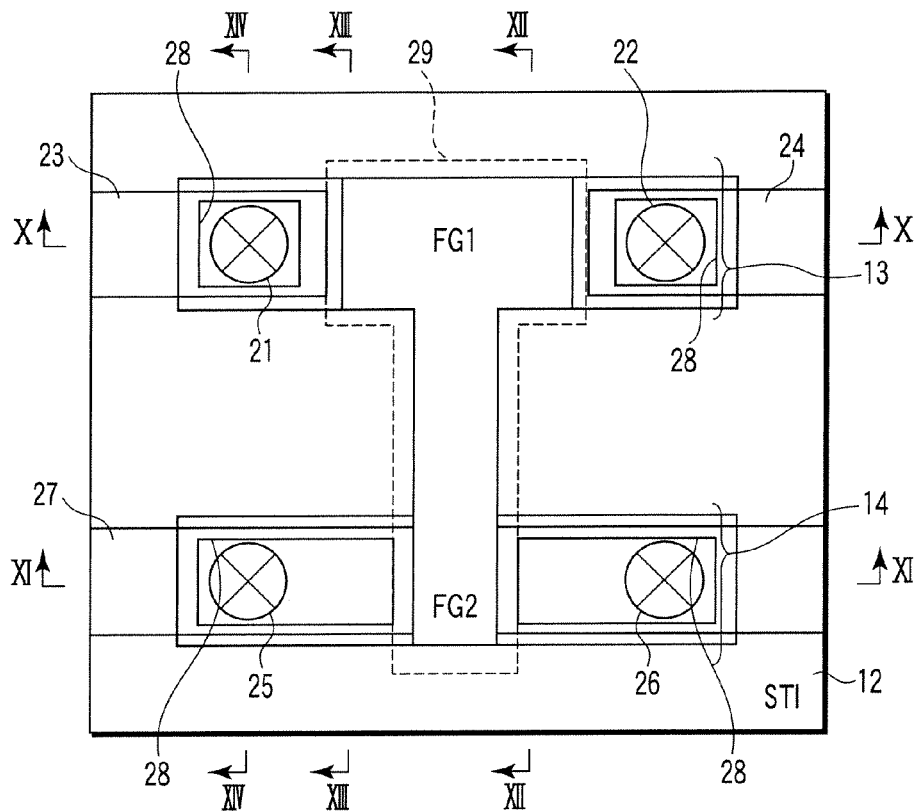
FIG. 9 is a plan view of the aging device in FIG. 8.
Figure 10:
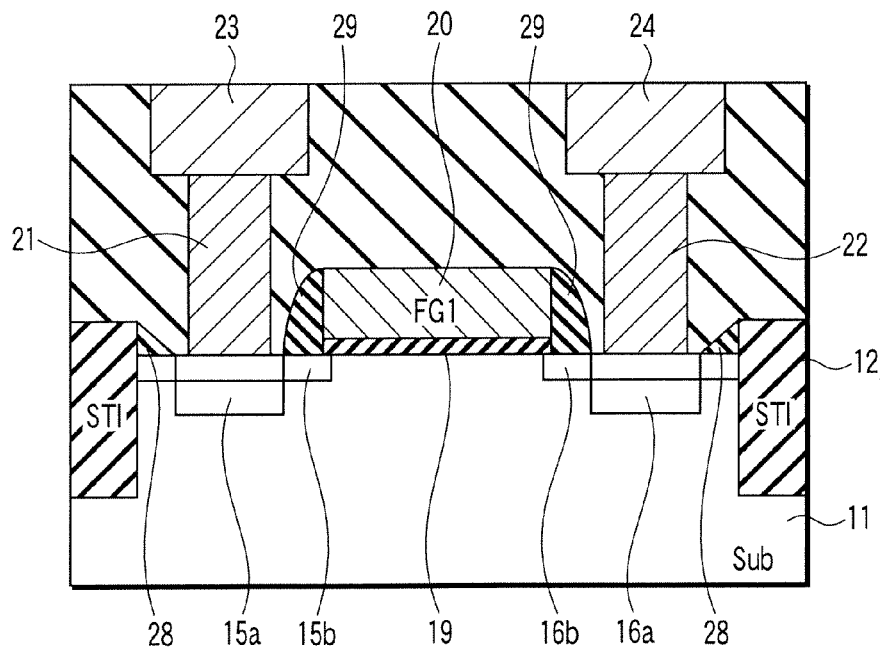
FIG. 10 is a sectional view along the X-X line in FIG. 9.
Figure 11:
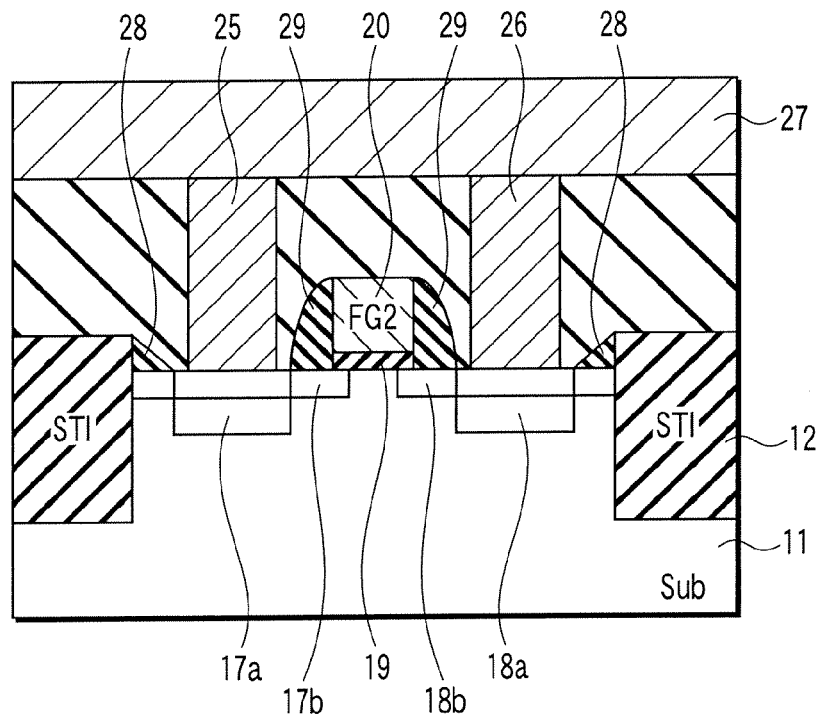
FIG. 11 is a sectional view along the XI-XI line in FIG. 9.
Figure 12:
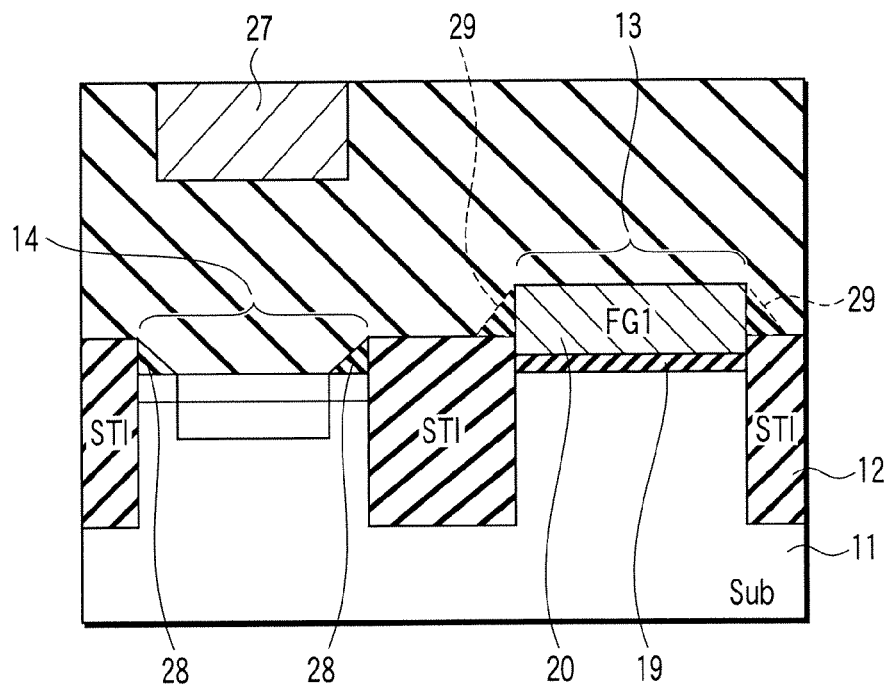
FIG. 12 is a sectional view along the XII-XII line in FIG. 9.

FIG. 9 is an upper view of the aging device in FIG. 8, FIG. 10 is a sectional view along the X-X line in FIG. 9, FIG. 11 is a sectional view along the XI-XI line in FIG. 9, and FIG. 12 is a sectional view along the XII-XII line in FIG. 9.

The element isolation insulating layer 12 having an STI structure is formed in a recessed portion of the semiconductor substrate 11. The element regions 13 and 14 are isolated from each other by the element isolation insulating layer 12. The operation element is formed in the element region 13, and the control element is formed in the element region 14.

The operation element is a MIS type field effect transistor.

In the semiconductor substrate 11 in the element region 13, the diffusion layers 15a and 16a serving as sources/drains and the diffusion layers 15b and 16b serving as extension regions or LDD regions are formed. A floating gate electrode (FG1) 20 is formed on the semiconductor substrate (channel region) 11 between the diffusion layers 15a and 15b and the diffusion layers 16a and 16b through the gate insulating film 19.

The control element is also a MIS type field effect transistor.

In the semiconductor substrate 11 in the element region 14, the diffusion layers 17a and 18a serving as sources/drains and the diffusion layers 17b and 18b serving as extension regions or LDD regions are formed. A floating gate electrode (FG2) 20 is formed on the semiconductor substrate (channel region) 11 between the diffusion layers 17a and 17b and the diffusion layers 18a and 18b through the gate insulating film 19.

The gate insulating film 19 is constituted by a silicon oxide layer, a silicon nitride layer, a high dielectric constant film (High-k film), or a lamination layer thereof. The high dielectric constant film is a film consisting of a material having a specific inductive capacity higher than that of silicon oxide.

The floating gate electrode 20 is formed to extend from the element region 13 to the element region 14. An area of the floating gate electrode 20 facing the semiconductor substrate 11 in the element region 13 is larger than an area of the floating gate electrode 20 facing the semiconductor substrate 11 in the element region 14.

The floating gate electrode 20 can be constituted by a conductive polysilicon layer, a metal layer, a silicide layer, or a lamination layer thereof. When the floating gate electrode 20 contains conductive polysilicon, the conductive polysilicon contains an n-type impurity or a p-type impurity.

In the embodiment, the upper surface of the element isolation insulating layer 12 is above the level of the upper surface of the semiconductor substrate 11, and the side wall insulating film 28 is formed on the side wall of the element isolation insulating layer 12. In this manner, the diffusion layers 15a, 16a, 17a, and 18a serving as sources/drains are not formed in the element regions 13 and 14 immediately below the side wall insulating film 28.

Therefore, the deepest portions (bottom surfaces) of the diffusion layers 15a, 16a, 17a, and 18a are isolated from the element isolation insulating layer 12.

The side wall insulating film 29 is formed on the side wall of the floating gate electrode (FG1 and FG2) 20. The side wall insulating film 29 is required to form the diffusion layers 15b, 16b, 17b, and 18b serving as extension regions or LDD regions of a field effect transistor.

Since the side wall insulating films 28 and 29 are simultaneously formed by a side-wall remaining process, a reduction in manufacturing cost by simplifying manufacturing steps can be realized.

The diffusion layer 15a of the operation element is connected to a conductive layer (electrode) 23 through the contact plug 21. The diffusion layer 16a of the operation element is connected to the conductive layer (electrode) 24 through the contact plug 22.

The diffusion layers 17a and 18a of the control element are connected to the conductive layer (electrode) 27 through the contact plugs 25 and 26, respectively.

In this case, when the operation element is a normally-off type n-channel field effect transistor, an initial state is set in such a manner that a positive potential is applied to the conductive layer 27 and the control element discharges electrons in the floating gate electrode 20 to the semiconductor substrate (channel region) 11. At this time, the floating gate electrode 20 has a positive potential by capacitive coupling to the channel region.

PN-junction surfaces between the diffusion layers 15a, 15b, 16a, 16b, 17a, 17b, 18a, and 18b of the field effect transistors serving as the control elements and the operation elements and the semiconductor substrate 11 and a depletion layer generated nearby spread, when the floating gate electrode 20 has a positive potential.

However, since the deepest portions of the diffusion layers 15a, 16a, 17a, and 18a are separated from the element isolation insulating layer 12, the depletion layer can be effectively prevented from extending to a portion immediately below the element isolation insulating layer 12.

Therefore, the depletion layer extending from the control element side is not in contact with the depletion layer extending from the operation element side at the portion immediately below the element isolation insulating layer 12. In this manner, a leakage current (punch through phenomenon) between the control element and the operation element in the initial setting can be prevented.

The embodiment can be applied not only to a normally-off type aging device but also to a normally-on type aging device in which an operation element is in an off state in an initial state and turned on after a predetermined period of time.

Figure 13:
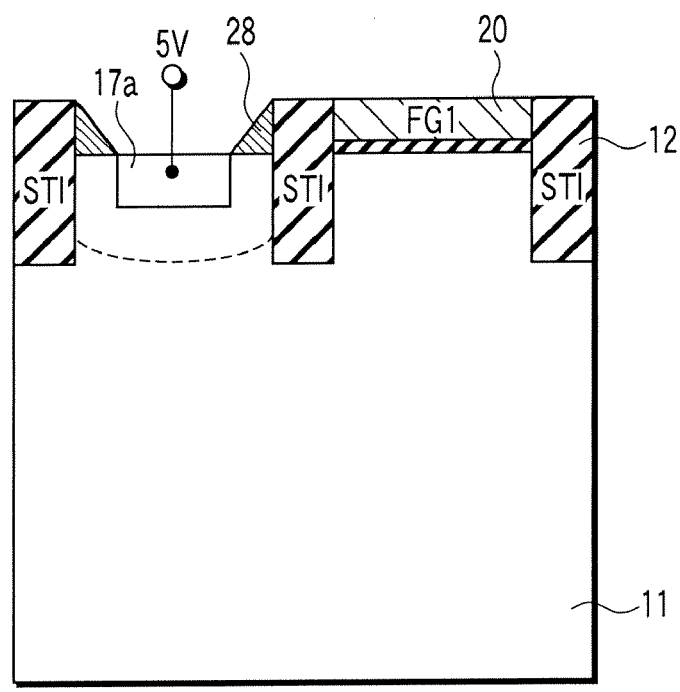
FIG. 13 is a diagram showing a simulation result of spreading of a depletion layer.
Figure 14:
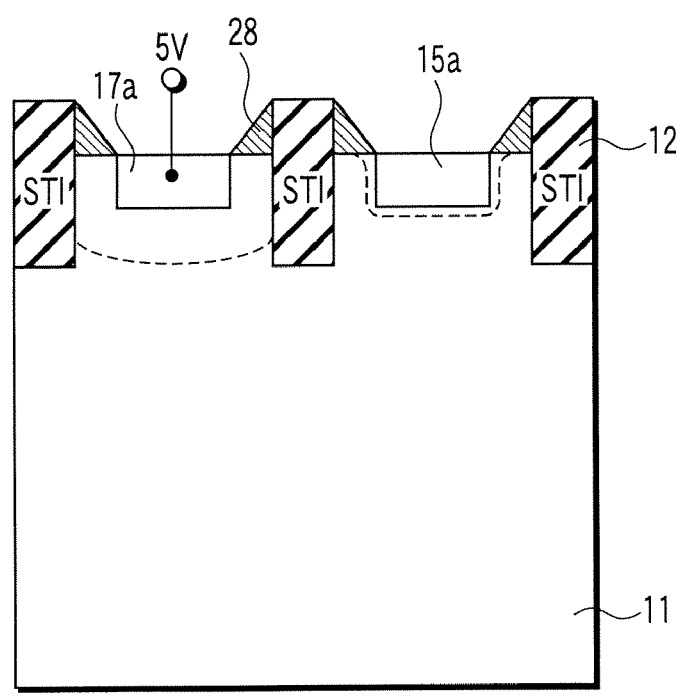
FIG. 14 is a diagram showing a simulation result of spreading of the depletion layer.

FIGS. 13 and 14 show simulation of spreading of a depletion layer in an initial setting (writing).

A target is an aging device having the structure shown in FIGS. 8 to 12. Therefore, FIG. 13 corresponds to a section along the XIII-XIII line in FIG. 9, and FIG. 14 corresponds to a section along the XIV-XIV line in FIG. 9.

A thickness (width in a direction parallel to the substrate) of the side wall insulating film 28 is set at 85 nm.

The other conditions are set to be equal to the conditions in the simulation shown in FIGS. 6 and 7. More specifically, the semiconductor substrate 11 was of a p-type and had an impurity concentration of $5\times10^{17}$ cm$^{-3}$, the diffusion layers 15a, 16a, 17a, and 18a were of n-types and had impurity concentrations of $1\times10^{20}$ cm$^{-3}$, and the potentials of the diffusion layers 17a and 18a were set at 5V.

As a result, as is apparent from comparison with FIGS. 6 and 7 serving as a reference example, it was confirmed that depletion layers in the control element and the operation element were suppressed from extending.

In this manner, according to the embodiment, independently of techniques such as highly concentrating of a substrate, formation of Halo, ion implantation of an impurity, optimization of a width of an element isolation insulating layer, the depletion layers can be suppressed from spreading in the initial setting.

Generation of a leakage current by spreading of the depletion layers depends not only on a distance between the operation element and the control element but also on A. junction depth of the diffusion layers 15a, 16a, 17a, and 18a, B. depth of the element isolation insulating layer 12, C. impurity concentration of the semiconductor substrate 11, and the like.

With respect to the structure (comparative example) in FIGS. 1 to 5 and the structure in FIGS. 8 to 12, simulation to check easiness of a contact between the depletion layer on the operation element side and the depletion layer on the control element side was performed by using the three elements A., B., and C. as parameters.

Since it is difficult to directly evaluate the easiness of the contact between the depletion layers, a width of an element isolation insulating layer (STI) was set at 1.3 μm, the potentials of the diffusion layers 17a and 18a were set at 5V, and then relationships among junction depths of the diffusion layers 15a, 16a, 17a, and 18a when an end portion of the depletion layer generated on the control element side reached a bottom surface of the element isolation insulating layer 12, a depth of the element isolation insulating layer 12, and an impurity concentration of the semiconductor substrate 11 were examined.

Figure 15:
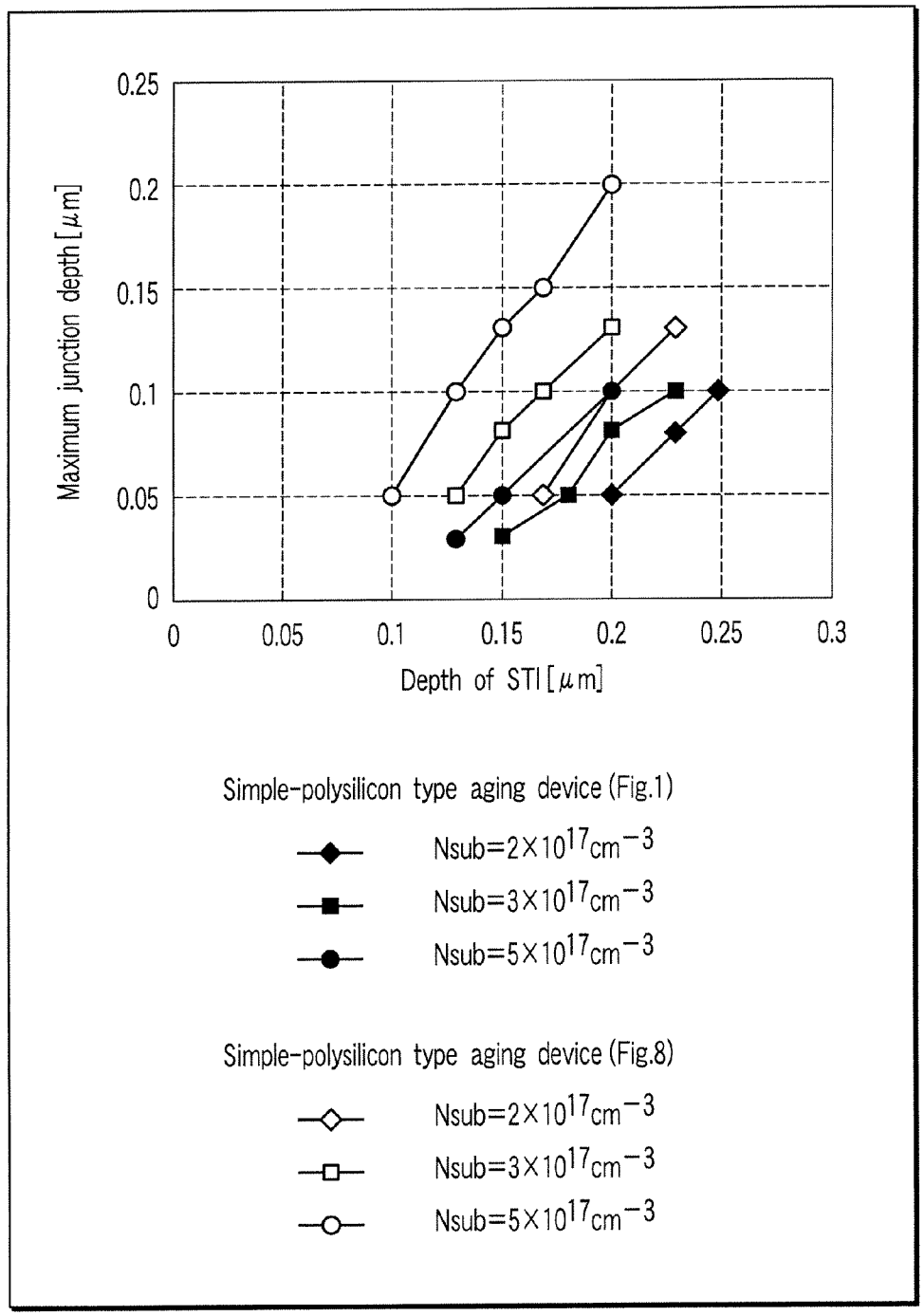
FIG. 15 is a diagram showing a suppression effect of spreading of the depletion layer.

The result is shown in FIG. 15.

In this drawing, when a point is in a lower right region of each line, the depletion layers are not in contact with each other. When a point is in an upper left region, the depletion layers are in contact with each other.

A line based on the structure in FIGS. 8 to 12 is closer to the upper left region than a line based on the structure shown in FIGS. 1 to 5. This means that, according to the structure shown in FIGS. 8 to 12, the element isolation insulating layer (STI) is shallow, and the depletion layers are not easily in contact with each other even though the junction depth increases. In other words, under the same conditions, even though the depletion layers are in contact with each other in the structure shown in FIGS. 1 to 5, the depletion layers may not be in contact with each other in the structure shown in FIGS. 8 to 12.

In the simulation, for the sake of simplification, a direct tunnel current or an FN tunnel current generated between a floating gate electrode (FG1 and FG2) and a semiconductor substrate is not considered.

As described above, according to the embodiment, a leakage current generated by a contact between the depletion layers is prevented by a simple method to make it possible to increase a design margin without increasing manufacturing cost and to more accurately control an aging of an aging device.

(2) Modification

A modification of the structure shown in FIGS. 8 to 12 will be described below.

Figure 16:
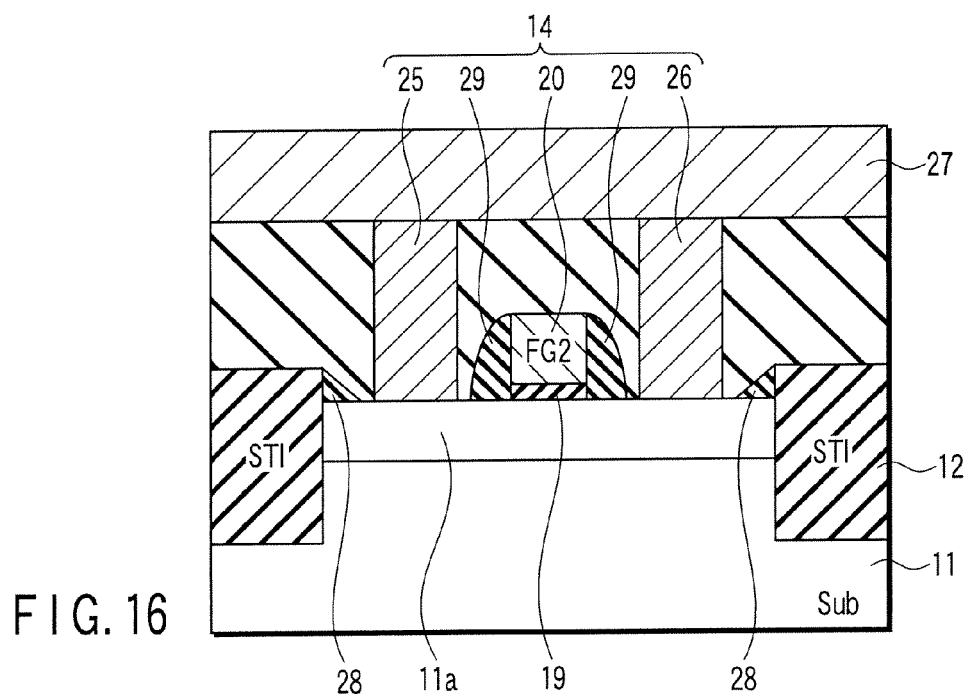
FIG. 16 is a sectional view showing a modification of the structure of a control element.

FIG. 16 shows a modification of the structure in FIGS. 8 to 12. FIG. 16 corresponds to FIG. 11.

The modification relates to a structure of a MIS type device serving as a control element.

A characteristic feature of the structure in FIG. 16 is that a well region 11a is formed in the semiconductor substrate 11 in the element region 14. On the well region 11a, the floating gate electrode (FG2) 20 is formed through the gate insulating film 19.

This structure is different from the structure shown in FIGS. 8 to 12 in that diffusion layers serving as sources/drains are not present in the element region 14.

Also in this structure, the deepest portion of the diffusion layer of the MIS type device serving as the operation element is isolated from the element isolation insulating layer to make it possible to solve the problem that the depletion layer on the operation element side and the depletion layer on the control element side are in contact with each other.

(3) Method of Manufacturing Aging Device

An example of a method of manufacturing a single-polysilicon type aging device shown in FIGS. 8 to 12 will be described below.

Figure 17:
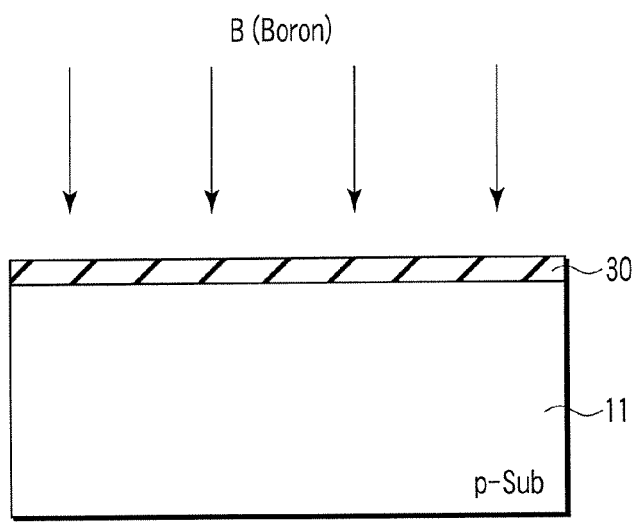
FIG. 17 is a sectional view showing one step of a method of manufacturing an aging device.

As shown in FIG. 17, a p-type silicon substrate 11 having an impurity concentration of $5 \times 10^{15}$ cm$^{-3}$ and an orientation (100) is prepared, and a sacrifice oxide film 30 having a thickness of 10 nm is formed on the silicon substrate 11 by a thermal oxidation method.

A p-type impurity such as B (boron) is ion-implanted (so-called channel implantation) in the silicon substrate 11. Then, heat treatment is performed to form a channel impurity profile in the silicon substrate 11.

Thereafter, the sacrifice oxide film 30 is removed.

Figure 18:
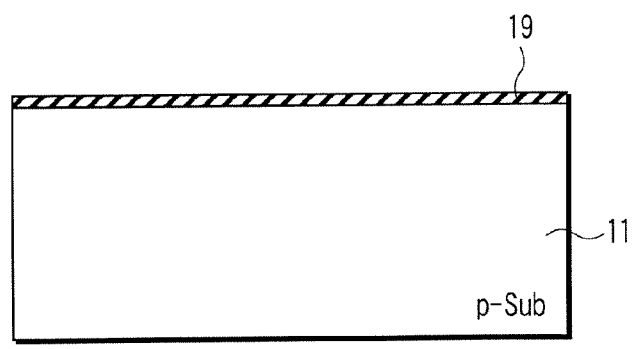
FIG. 18 is a sectional view showing one step of the method of manufacturing an aging device.

As shown in FIG. 18, the gate insulating film 19 consisting of silicon oxide is formed on the silicon substrate 11 by a thermal oxidation method. The thickness of the gate insulating film 19 is set at a value depending on specifications of an aging device.

Figure 19:
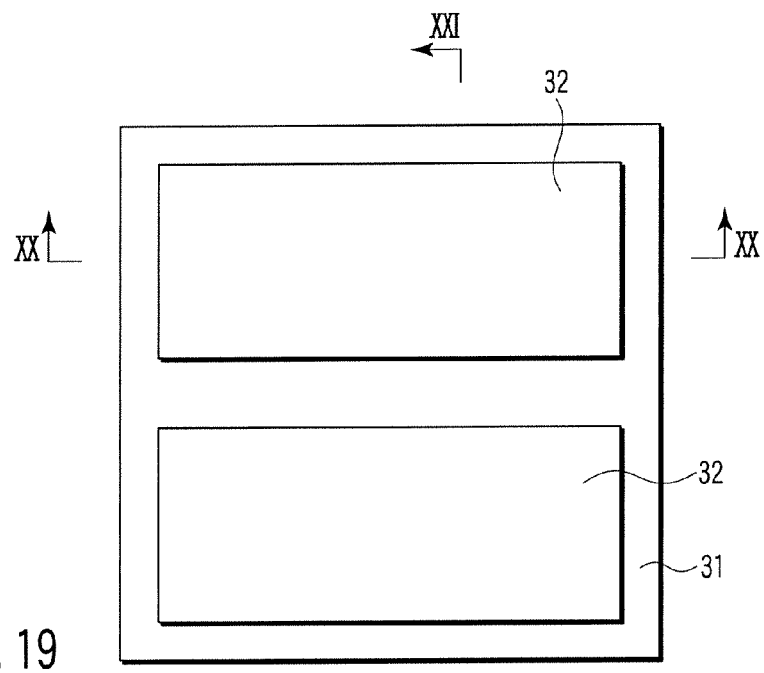
FIG. 19 is a sectional view showing one step of the method of manufacturing an aging device.
Figure 20:
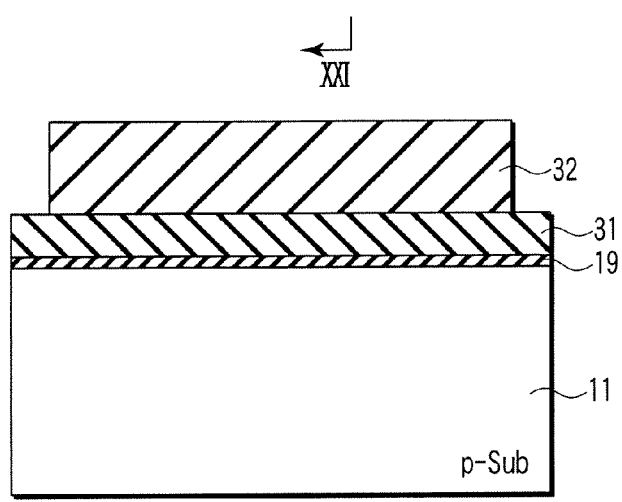
FIG. 20 is a sectional view along the XX-XX line in FIG. 19.
Figure 21:
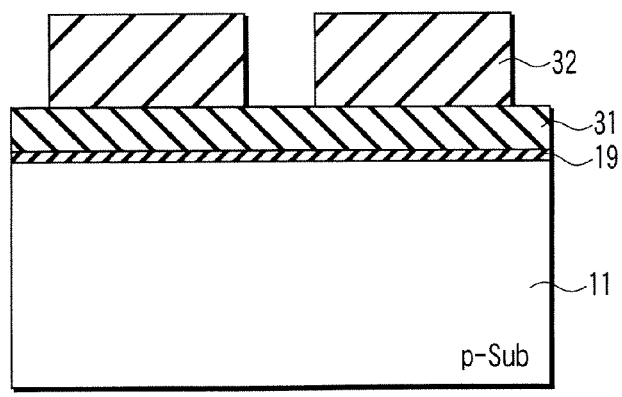
FIG. 21 is a sectional view along the XXI-XXI line in FIG. 19.

As shown in FIGS. 19 to 21, a silicon nitride film ($Si_3N_4$) 31 is formed on the gate insulating film 19 by a CVD method. Subsequently, a resist pattern 32 is formed on the silicon nitride film 31 by a PEP (photo engraving process).

The silicon nitride film 31, the gate insulating film (silicon oxide film) 19, and the silicon substrate 11 are sequentially etched by RIE using the resist pattern 32 as a mask.

Figure 22:
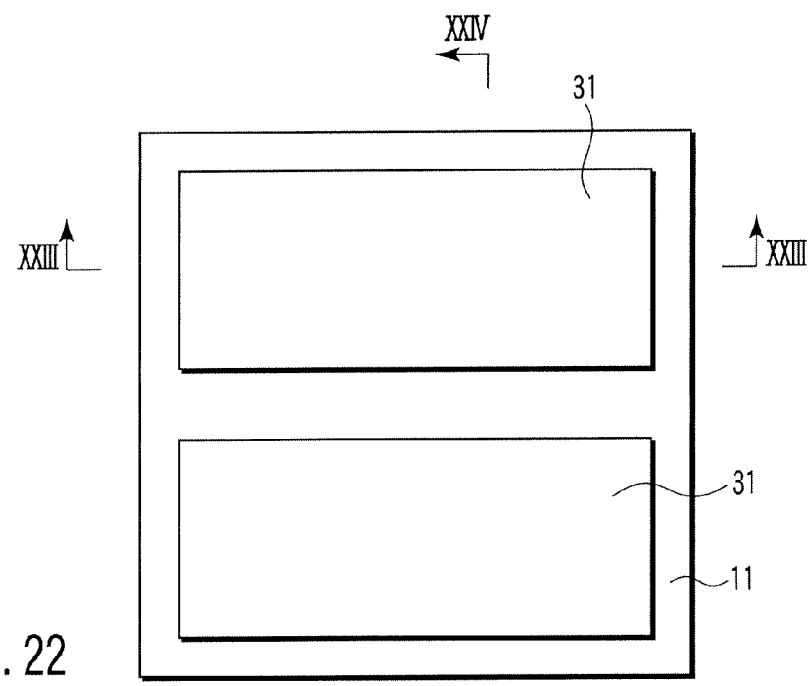
FIG. 22 is a plan view showing one step of the method of manufacturing an aging device.
Figure 23:
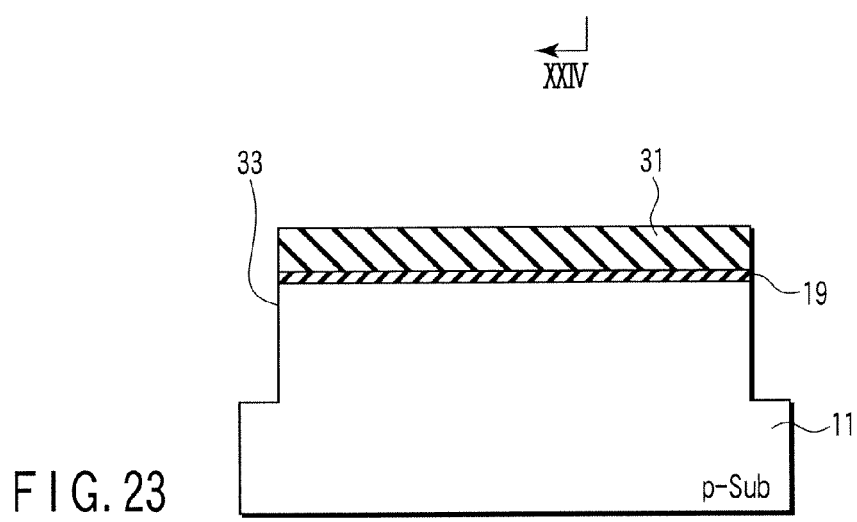
FIG. 23 is a sectional view along the XXIII-XXIII line in FIG. 22.
Figure 24:
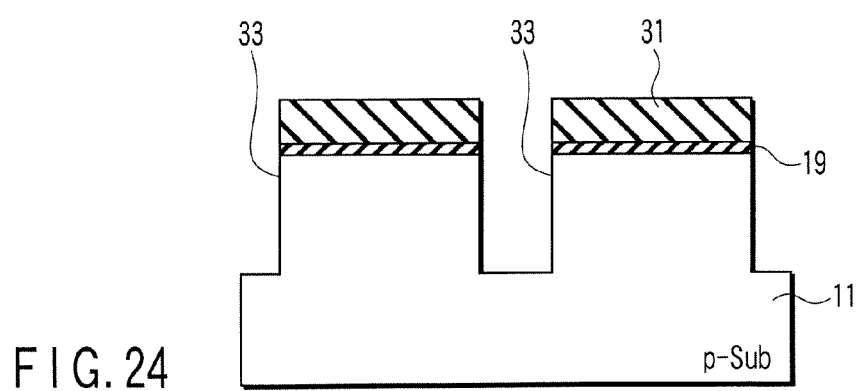
FIG. 24 is a sectional view along the XXIV-XXIV in FIG. 22.

Thereafter, when the resist pattern 32 is removed, as shown in FIGS. 22 to 24, a trench 33 for an STI is formed.

Figure 25:
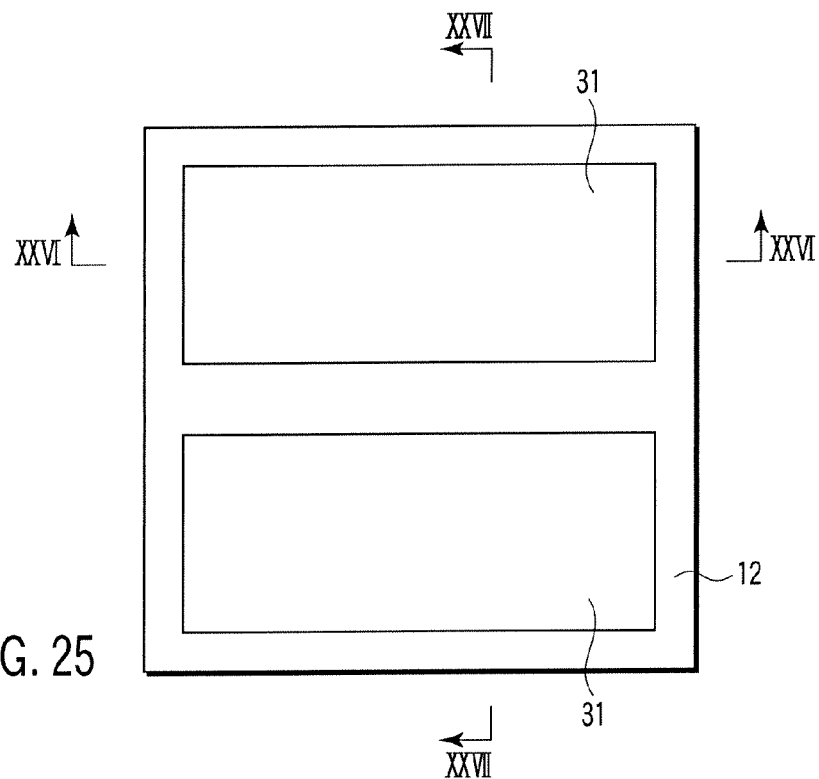
FIG. 25 is a plan view showing one step of the method of manufacturing an aging device.
Figure 26:
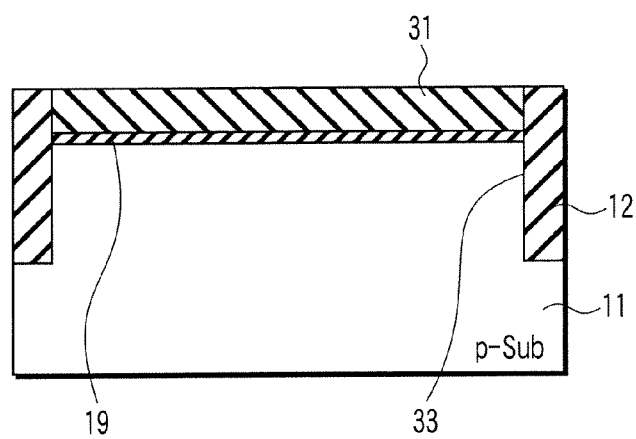
FIG. 26 is a sectional view along the XXVI-XXVI line in FIG. 25.
Figure 27:
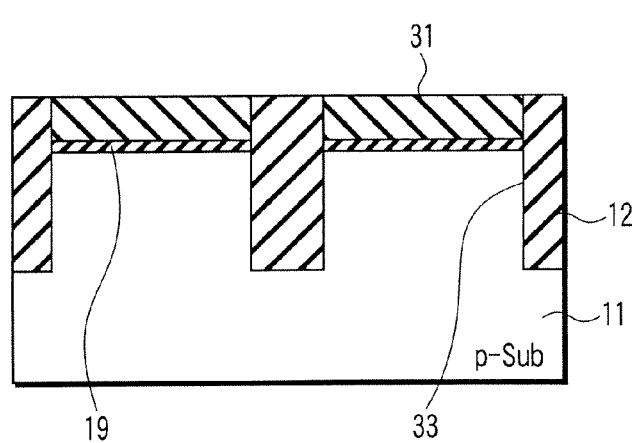
FIG. 27 is a sectional view along the XXVII-XXVII line in FIG. 25.

As shown in FIGS. 25 to 27, a TEOS film which completely fills the trench 33 is formed by the CVD method. When the TEOS film is polished by a CMP method until the surface of the silicon nitride film 31 is exposed, the TEOS film remains only in the trench 33, and the element isolation insulating layer 12 having an STI structure is formed.

In this case, the height of the side wall of the element isolation insulating layer 12 projecting from the surface of the semiconductor substrate 11 is equal to the thickness of the silicon nitride film 31.

In fact, since the TEOS film is over-etched by the CMP method, the upper surface of the element isolation insulating layer 12 is below the level of the upper surface of the silicon nitride film 31.

Figure 28:
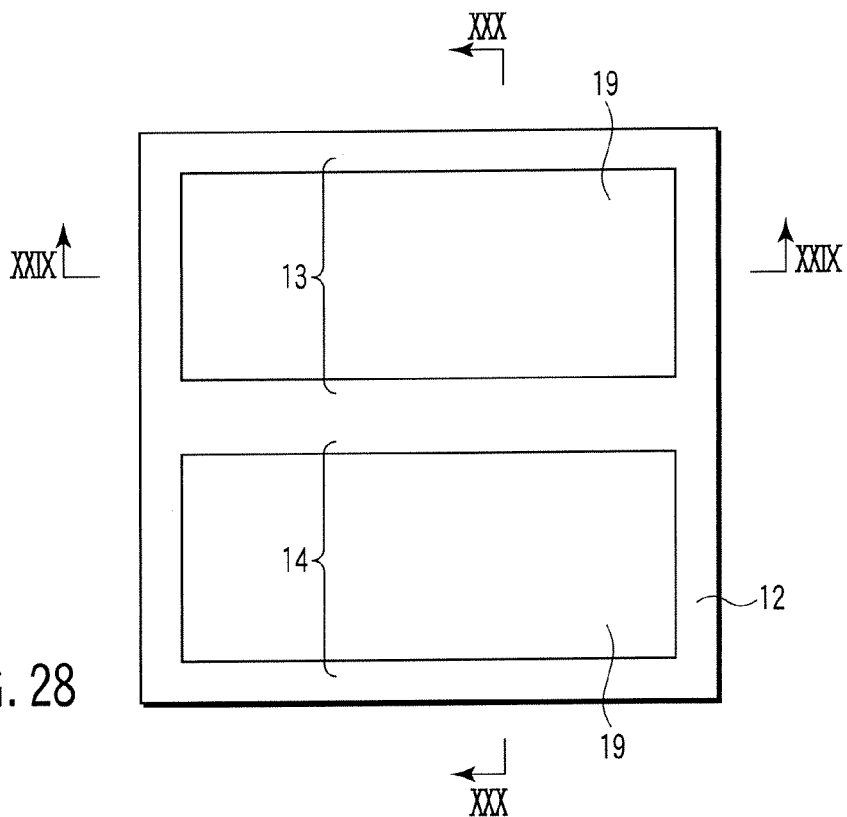
FIG. 28 is a plan view showing one step of the method of manufacturing an aging device.
Figure 29:
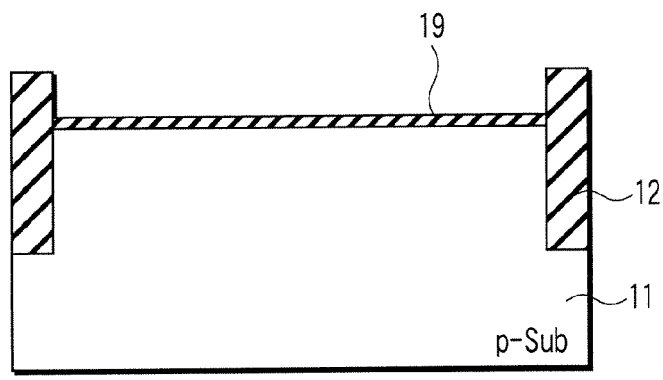
FIG. 29 is a sectional view along the XXIX-XXIX line in FIG. 28.
Figure 30:
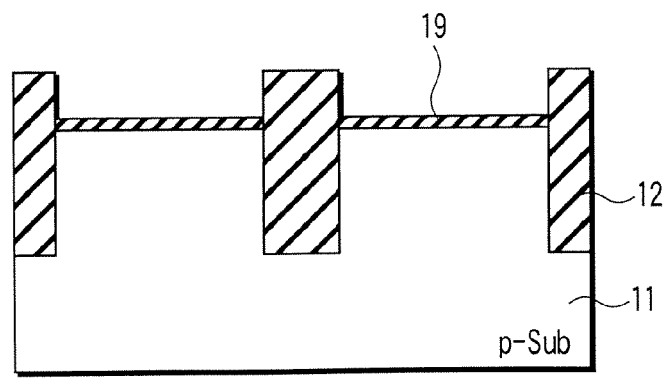
FIG. 30 is a sectional view along the XXX-XXX line in FIG. 28.

Thereafter, when the silicon nitride film 31 is removed, as shown in FIGS. 28 to 30, the element isolation insulating layer 12 having the STI structure projecting from the surface of the silicon substrate 11 is formed. Regions surrounded by the element isolation insulating layer 12 serve as the element regions 13 and 14.

Figure 31:
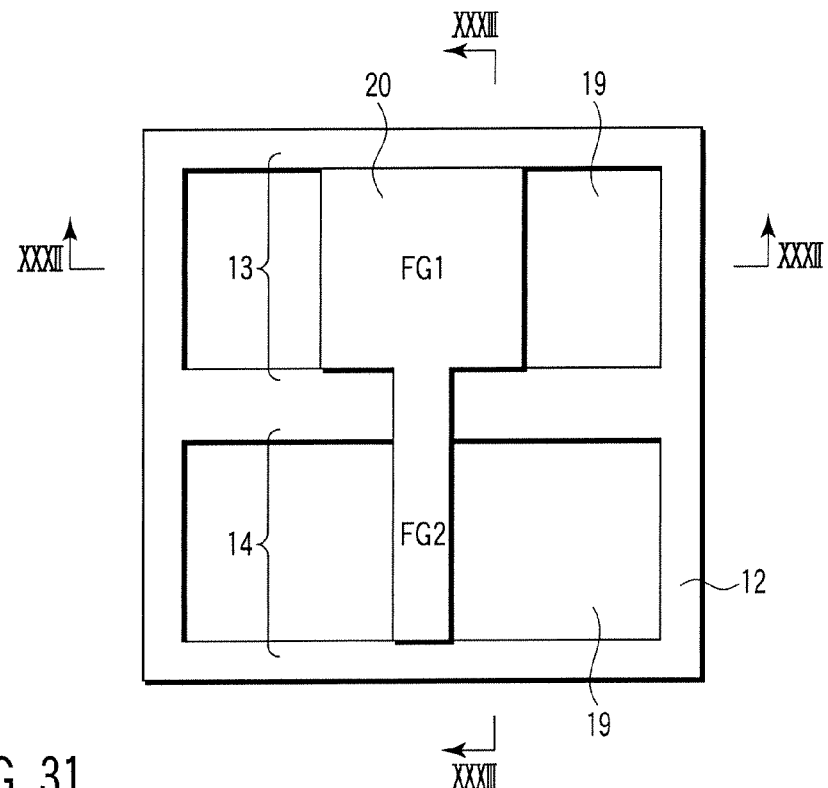
FIG. 31 is a plan view showing one step of the method of manufacturing an aging device.
Figure 32:
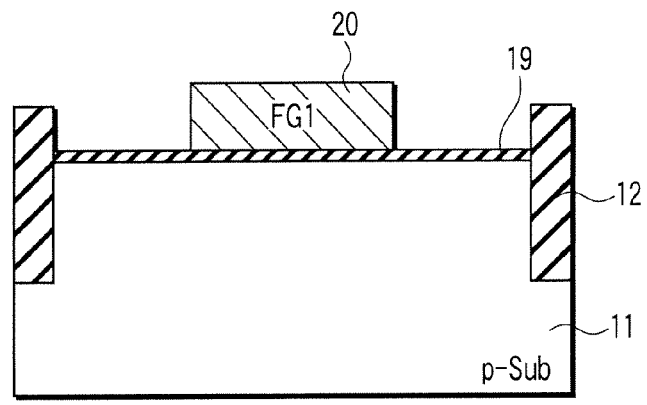
FIG. 32 is a sectional view along the XXXII-XXXII line in FIG. 31.
Figure 33:
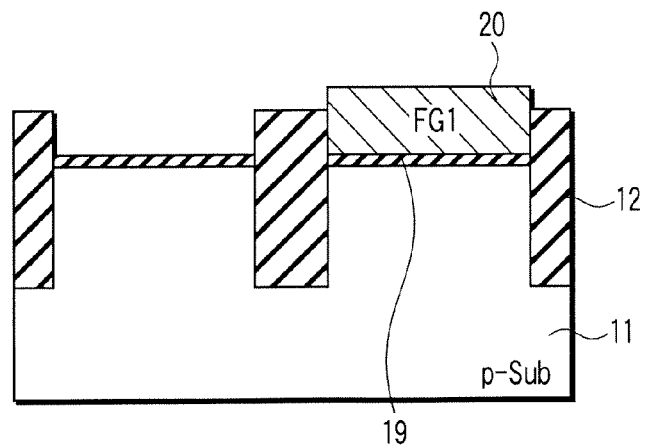
FIG. 33 is a sectional view along the XXXIII-XXXIII line in FIG. 31.

As shown in FIGS. 31 to 33, a polycrystalline silicon film is formed on the element isolation insulating layer 12 and the element regions 13 and 14 by the CVD method. In the polycrystalline silicon film, an n-type impurity such as phosphorous is doped during deposition or thereafter to set an impurity concentration of $7 \times 10^{19}$ cm$^{-3}$.

A resist pattern is formed on the polycrystalline silicon film by PEP.

The polycrystalline silicon film is etched by RIE using the resist pattern as a mask to form a T-shaped floating gate electrode (FG1 and FG2) 20. The floating gate electrode 20 is formed to have a layout extending from the element region 13 to the element region 14.

Thereafter, the resist pattern is removed.

The surface of the floating gate electrode 20 is oxidized (so-called post-oxidizing process) by a thermal oxidizing method.

Figure 34:
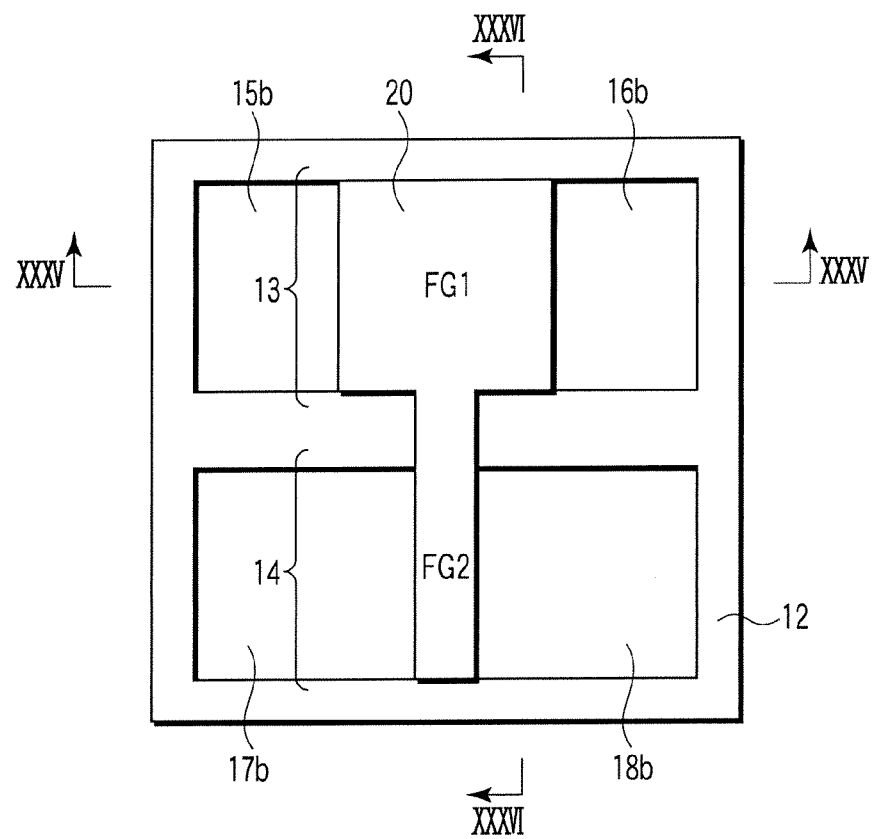
FIG. 34 is a plan view showing one step of the method of manufacturing an aging device.
Figure 35:
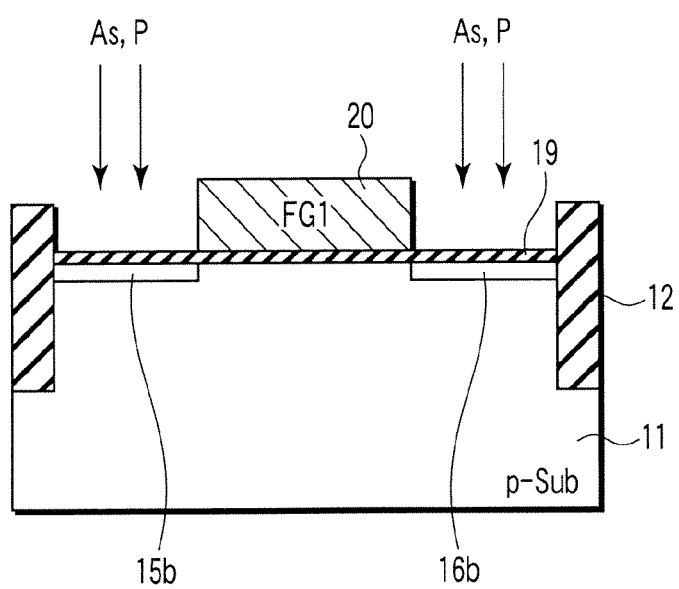
FIG. 35 is a sectional view along the XXXV-XXXV line in FIG. 34.
Figure 40:
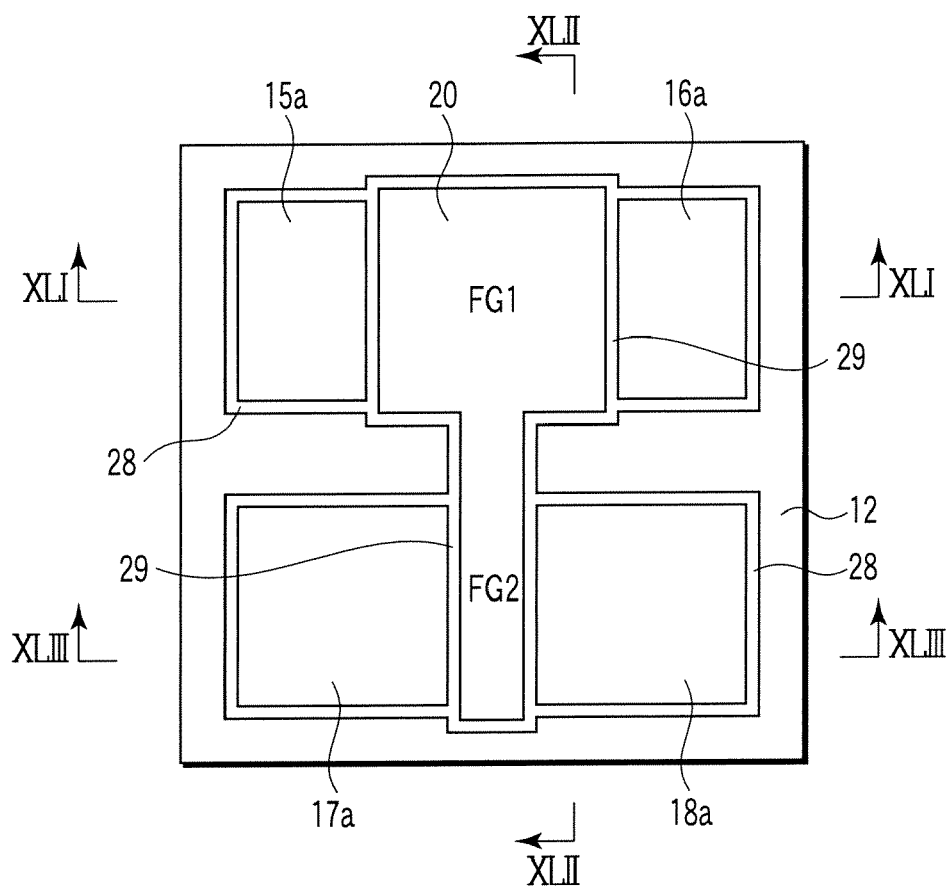
FIG. 40 is a plan view showing one step of the method of manufacturing an aging device.
Figure 41:
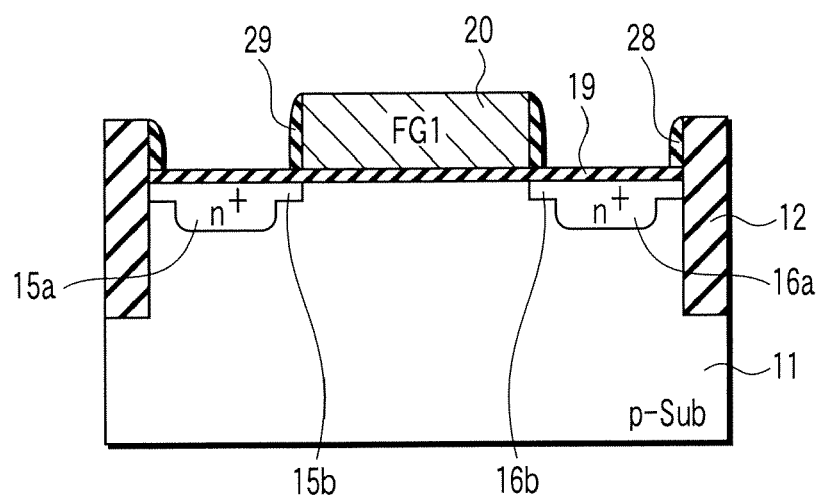
FIG. 41 is a sectional view along the XLI-XLI line in FIG. 40.

As shown in FIGS. 34 to 36, an n-type impurity such as As (arsenic) or P (phosphorous) is self-aligningly implanted in the silicon substrate 11 by an ion implantation method using the element isolation insulating layer 12 and the floating gate electrode 20 as masks.

By the ion implantation, the shallow and thin diffusion layers 15b, 16b, 17b, and 18b serving as extension regions or LDD regions are formed in the silicon substrate 11.

As shown in FIGS. 37 and 39, a TEOS film is formed on the element isolation insulating layer 12, the element regions 13 and 14, and the floating gate electrode 20 by the CVD method.

Thereafter, when the TEOS film is etched by RIE, the side wall insulating film 28 is formed on the side wall of the element isolation insulating layer 12, and the side wall insulating film 29 is formed on the side wall of the floating gate electrode 20.

The thicknesses (widths in a direction parallel to the substrate) of the side wall insulating films 28 and 29 depend on the heights of the side walls of the side wall insulating films 28 and 29.

More specifically, as the side walls of the side wall insulating films 28 and 29 are higher, the thicknesses of the side wall insulating films 28 and 29 increase. However, the thicknesses of the side wall insulating films 28 and 29 are smaller than the thickness of a TEOS film serving as a source of the side wall insulating films 28 and 29.

The side wall insulating films 28 and 29 are not limited to the TEOS films. For example, an insulating film such as a silicon nitride film can be used as the side wall insulating films 28 and 29.

The side wall insulating films 28 and 29 are not limited to single-layer structures, but laminated structures each constituted by a TEOS film and a silicon nitride film may also be used.

As shown in FIGS. 40 to 43, an n-type impurity such as As (arsenic) or P (phosphorous) is self-aligningly implanted in the silicon substrate 11 by an ion implantation method using the element isolation insulating layer 12, the floating gate electrode 20, and the side wall insulating films 28 and 29 as masks.

By the ion implantation, the diffusion layers 15a, 16a, 17a, and 18a which are deeper and more concentrated than the diffusion layers 15b, 16b, 17b, and 18b and which serve as sources/drains are formed in the silicon substrate 11. The impurity concentrations of the diffusion layers 15a, 16a, 17a, and 18a are set at values falling within, for example, the range of $1 \times 10^{19}$ to $1 \times 10^{20}$ cm$^{-3}$.

As a result, the deepest portions of the diffusion layers 15a, 16a, 17a, and 18a are isolated from the element isolation insulating layer 12 by the thickness of the side wall insulating film 28.

Thereafter, an interlayer insulating film, a contact hole, and an interconnection are formed to complete the single-polysilicon type aging device shown in FIGS. 8 to 12.

As described above, by employing the side-wall remaining process, aging devices having various specifications can be realized without changing a manufacturing line. More specifically, when the thickness of the silicon nitride film 31 described in FIGS. 25 to 27 is merely changed, the thickness of the side wall insulating film 28 can be controlled at high accuracy.

In the above example, the element isolation insulating layer (STI) is formed after the channel implantation and formation of the gate insulating film. However, the element isolation insulating layer may be formed first, and, thereafter, the channel implantation and the formation of the gate insulating film may be performed.

In this case, by using the gate insulating film 19 in FIGS. 18 to 30 as a sacrifice oxide film, the channel implantation is performed after the processes in FIGS. 28 to 30 are ended, and the gate insulating film may be formed after the sacrifice oxide film is removed.

FIGS. 44 to 50 show a modification of the manufacturing method shown in FIGS. 17 to 43.

As a characteristic feature of the manufacturing method, by employing a mask process in place of the side-wall remaining process, the structures shown in FIGS. 8 to 12 are obtained.

Operations performed until shallow and thin diffusion layers serving as extension regions or LDD regions are formed in a silicon substrate are performed by the same processes as those shown in FIGS. 17 to 36.

Figure 44:
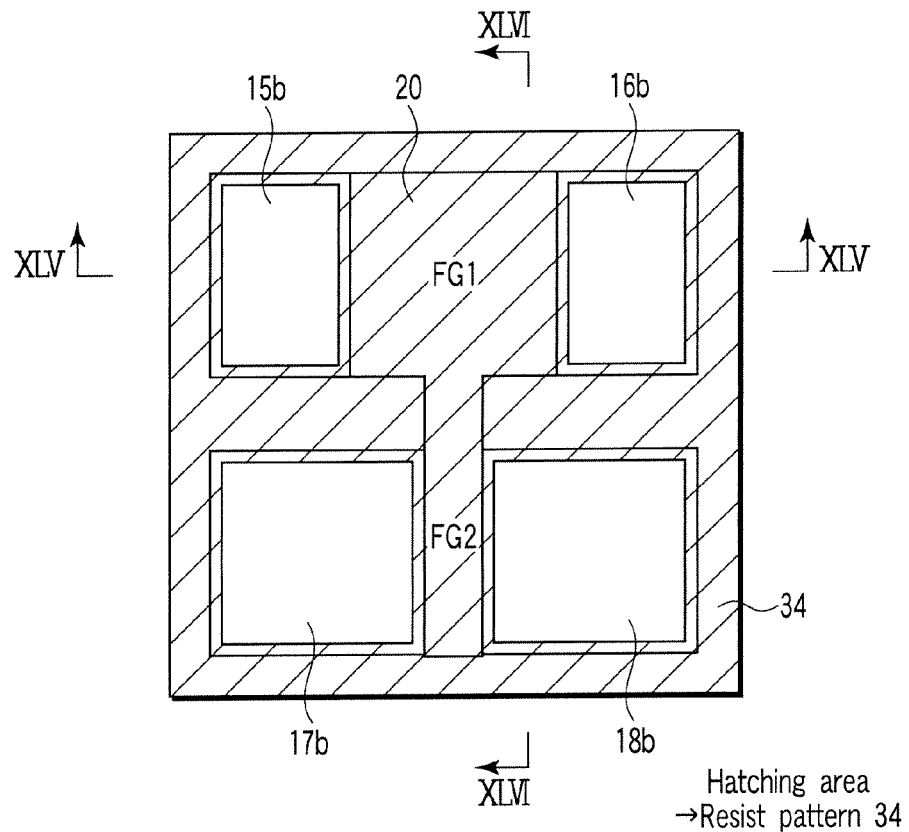
FIG. 44 is a plan view showing one step of the manufacturing method according to a modification.
Figure 45:
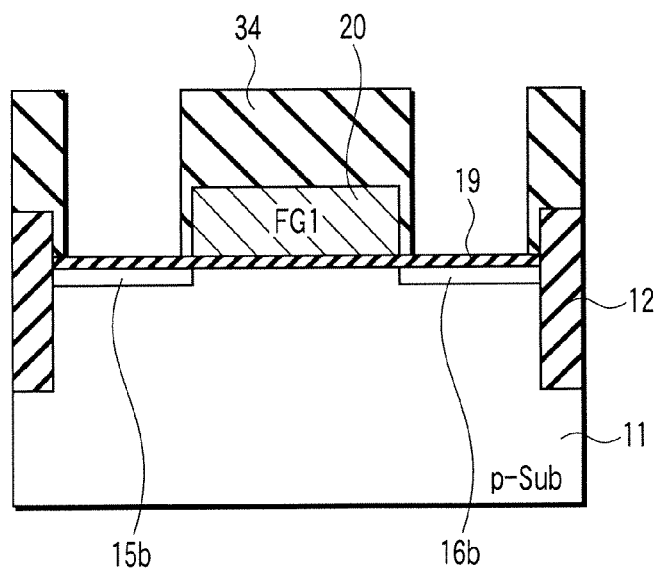
FIG. 45 is a sectional view along the XLV-XLV line in FIG. 44.
Figure 46:
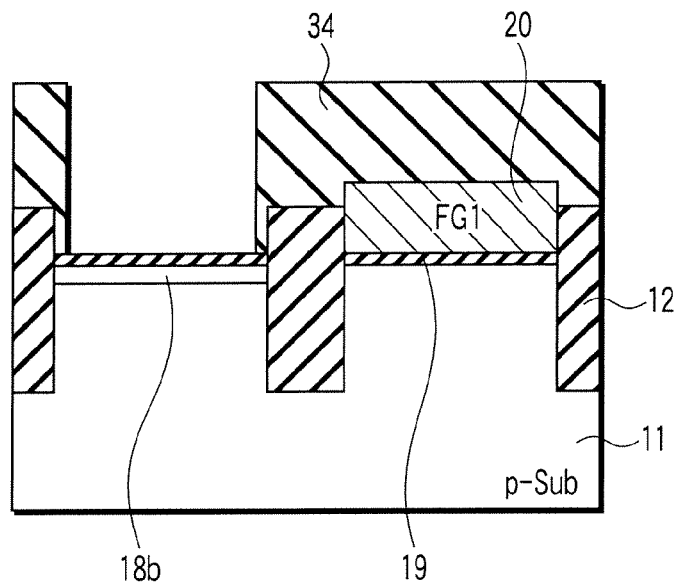
FIG. 46 is a sectional view along the XLVI-XLVI line in FIG. 44.
Figure 47:
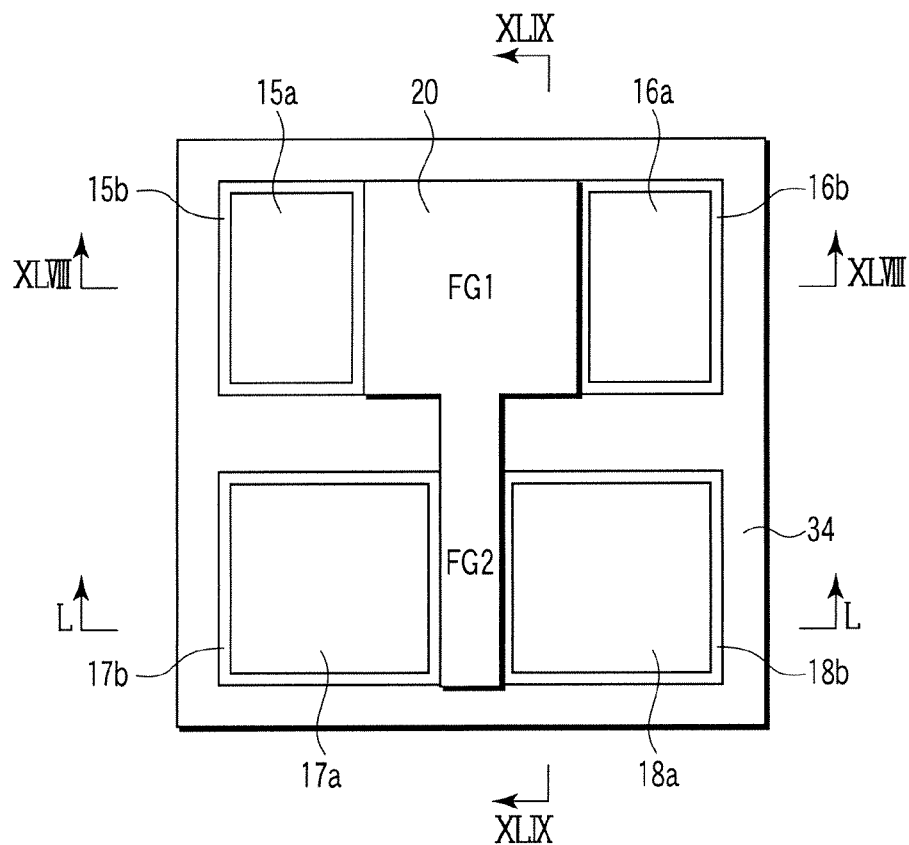
FIG. 47 is a plan view showing one step of a manufacturing method according to a modification.

As shown in FIGS. 44 to 46, a resist pattern 34 is formed on the element isolation insulating layer 12, the element regions 13 and 14, and the floating gate electrode 20.

By using the resist pattern 34 as a mask, an n-type impurity such as As (arsenic) or P (phosphorous) is implanted in the silicon substrate 11 by an ion-implantation method. Thereafter, the resist pattern 34 is removed.

As a result, as shown in FIGS. 47 to 50, the diffusion layers 15a, 16a, 17a, and 18a which are deeper and more concentrated than the diffusion layers 15b, 16b, 17b, and 18b and which serve as sources/drains are formed in the silicon substrate 11.

The deepest portions of the diffusion layers 15a, 16a, 17a, and 18a are isolated from the element isolation insulating layer 12 by the thickness of the side wall insulating film 28.

As described above, by using a mask process, the structure shown in FIGS. 8 to 12 can also be obtained.

When this process is employed, the number of times of PEP is increased by one, and thus the method is inferior to the method employing the side-wall remaining process in cost. Furthermore, a variation in characteristic of an aging device caused by misalignment of the resist pattern 34 serving as a mask must be considered.

(4) Other

When the operation element is an n-channel field effect transistor, a single-polysilicon type aging device is normally-on-operated to obtain a wide design margin. On the other hand, in a normally-off operation, spreading of a depletion layer does not pose a serious problem.

When the operation element is a p-channel field effect transistor, the single-polysilicon type aging device is normally-off-operated to obtain a wide design margin. On the other hand, in a normally-on operation, spreading of a depletion layer does not pose a serious problem.

For instance, the plane direction of the semiconductor substrate is one of (100) and (110). The semiconductor substrate having the plane direction (110) improve the performance of P channel MOSFET.

4. Application

FIGS. 51 and 52 show a structure obtained by applying a single-polysilicon type aging device according to an example of the present invention to a CMOS circuit.

The CMOS circuit has a low-voltage type MOSFET driven by a low voltage and a high-voltage type MOSFET driven by a high voltage.

An extension region (LDD region) of the high-voltage type MOSFET is formed to be longer than an extension region of the low-voltage type MOSFET to prevent the element from being broken by a high voltage.

For this purpose, for example, a side-wall insulating film 29a of one type is formed on a side wall of a gate electrode of the low-voltage type MOSFET, and side-wall insulating films 29a and 29b of two types are formed on a side wall of a gate electrode of the high-voltage type MOSFET.

Therefore, when the aging device and a peripheral circuit (MOSFET) are simultaneously formed by a common process, as a structure of the aging device, as shown in FIG. 51, the structure having the side-wall insulating film 29a of one type and, as shown in FIG. 52, the structure having the side-wall insulating films 29a and 29b of two types can be selectively realized.

On a side wall of the element isolation insulating layer 12 surrounding the low-voltage type MOSFET and the high-voltage type MOSFET, the side wall insulating film 28 is also formed.

Therefore, source/drain diffusion layers 35a and 35b of the low-voltage type MOSFET and the high-voltage type MOSFET have the deepest portions isolated from the element isolation insulating layer 12 as in the aging device.

In this manner, when the example of the present invention is applied to a MOSFET constituting a CMOS circuit, in terms of prevention of an electrical short between elements, the example of the present invention is very effective.

When a very high voltage is applied to the high-voltage type MOSFET, the extension region may have to be loner than a length with which the side-wall insulating films 29a and 29b can cope.

In this case, the source/drain diffusion layer 35b of the high-voltage type MOSFET is formed by ion implantation using a mask independently of the side-wall insulating films 29a and 29b to realize an extension region having a sufficient length.

The aging device employs the same structure as that of the low-voltage type MOSFET, i.e., a structure using the side-wall insulating film 29a.

Since a single-polysilicon type aging device according to the example of the present invention has high reliability and low cost and can flexibly cope with a change in specification, application to a security contents product is hopefully viewed.

5. Conclusion

According to the example of the present invention, an aging of an aging device can be accurately controlled without increasing manufacturing cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An aging device comprising:
a semiconductor substrate;
an element isolation insulating layer which is formed in a recessed portion of the semiconductor substrate and which has an upper surface higher than an upper surface of the semiconductor substrate;
first and second element regions isolated by the element isolation insulating layer;
first and second diffusion layers formed in the semiconductor substrate in the first element region;
a first gate insulating film formed on the semiconductor substrate between the first and second diffusion layers;
a second gate insulating film formed on the semiconductor substrate in the second element region;
a floating gate electrode formed on the first and second gate insulating films and formed to extend from the first element region to the second element region,
a first contact plug which is connected to the first diffusion layer;
a second contact plug which is connected to the second diffusion layer;
a third contact plug which is connected to the semiconductor substrate in the second element region and which is provided at one side of the floating gate electrode in the second element region;
a fourth contact plug which is connected to the semiconductor substrate in the second element region and which is provided at the other side of the floating gate electrode in the second element region;
a conductive layer which is provided on the third and fourth contact plugs and which is connected to the third and fourth contact plugs mutually,
wherein the deepest portions of the first and second diffusion layers are isolated from the element isolation insulating layer, and a width of the floating gate electrode on the first element region is larger than a width of the floating gate electrode on the second element region; and
a timer comprising,
a control element including the semiconductor substrate in the second element region and the floating gate on the second element region, the control element configured to execute a timing initialization in which the control element is configured to extract electrons from the floating gate electrode through the second gate insulating film or to inject electrons into the floating gate electrode through the second gate insulating film, and
an operation element including the semiconductor substrate in the first element region, the floating gate on the first element region, the first diffusion layer and the second diffusion layer, the operation element configured to change from an off-state to an on-state or from the on-state to the off-state by leakage of the electrons from the floating gate electrode thereby to detect a timing period.

2. The aging device according to claim 1, further comprising side-wall insulating films formed on a side wall facing the first and second element regions of the element isolation insulating layer and on a side wall of the floating gate electrode, respectively.

3. The aging device according to claim 2, wherein the first and second diffusion layers are each constituted by a shallow portion immediately below the side-wall insulating film and a deep portion surrounded by the shallow portion.

4. The aging device according to claim 1, further comprising third and fourth diffusion layers formed in the semiconductor substrate in the second element region,
wherein the second gate insulating film and the floating gate electrode are formed on the semiconductor substrate between the third and fourth diffusion layers, and the deepest portions of the third and fourth diffusion layers are isolated from the element isolation insulating layer.

5. The aging device according to claim 4, further comprising side-wall insulating films formed on a side wall facing the first and second element regions of the element isolation insulating layer and on a side wall of the floating gate electrode, respectively.

6. The aging device according to claim 5, wherein each of the first, second, third, and fourth diffusion layers is constituted by a shallow portion immediately below the side-wall insulating film and a deep portion surrounded by the shallow portion.

7. The aging device according to claim 1, further comprising a well region formed in the semiconductor substrate in the second element region,
wherein the second gate insulating film and the floating gate electrode are formed on the well region.

8. The aging device according to claim 1, wherein an area of the floating gate electrode facing the semiconductor substrate in the first element region is larger than an area of the floating gate electrode facing the semiconductor substrate in the second element region.

9. The aging device according to claim 1, wherein the first and second gate insulating films comprise a material having a specific inductive capacity higher than that of silicon oxide.

10. A semiconductor integrated circuit comprising:
the aging device according to claim 1; and
an FET which is operated within a predetermined period of time measured by the aging device and which has a source/drain diffusion layer and a gate electrode.

11. The semiconductor integrated circuit according to claim 10, wherein the deepest portion of the source/drain diffusion layer of the FET is isolated from the element isolation insulating layer.

12. The semiconductor integrated circuit according to claim 10, further comprising side-wall insulating films formed on a side wall facing the first and second element regions of the element isolation insulating layer, on a side wall of the floating gate electrode, and on a side wall of the gate electrode of the FET, respectively.

13. The semiconductor integrated circuit according to claim 12, wherein a structure of the side-wall insulating film formed on the side wall of the gate electrode of the FET is the same as those of the side-wall insulating films formed on the side wall facing the first and second element regions of the element isolation insulating layer and on the side wall of the floating gate electrode.

* * * * *